US012495581B2

(12) United States Patent
Kang et al.

(10) Patent No.: US 12,495,581 B2
(45) Date of Patent: Dec. 9, 2025

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Sangmin Kang, Hwaseong-si (KR); Junghwan Kim, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 627 days.

(21) Appl. No.: 17/696,258

(22) Filed: Mar. 16, 2022

(65) Prior Publication Data

US 2022/0416052 A1 Dec. 29, 2022

(30) Foreign Application Priority Data

Jun. 25, 2021 (KR) .................. 10-2021-0083331

(51) Int. Cl.
*H10D 30/63* (2025.01)
*H10B 41/27* (2023.01)
(Continued)

(52) U.S. Cl.
CPC ......... *H10D 30/6737* (2025.01); *H10B 41/27* (2023.02); *H10B 43/27* (2023.02);
(Continued)

(58) Field of Classification Search
CPC ........ H10B 43/27; G11C 16/08; H10D 30/63; H10D 30/6737; H10D 30/0411
See application file for complete search history.

(56) References Cited

U.S. PATENT DOCUMENTS 9,831,268 B2   11/2017   Alsmeier
9,960,178 B2   5/2018   Kawai et al.
(Continued)

FOREIGN PATENT DOCUMENTS

KR   10-2002-0033373 A   5/2002
KR   10-2013-0005430 A   1/2013
(Continued)

OTHER PUBLICATIONS

Korean Office Action dated May 16, 2025 issued in Korean Patent Application No. 10-2021-0083331.

*Primary Examiner* — Errol V Fernandes
(74) *Attorney, Agent, or Firm* — Harness, Dickey & Pierce, P.L.C.

(57) ABSTRACT

A semiconductor device includes a substrate; gate electrodes spaced apart from each other and stacked in a direction, perpendicular to an upper surface of the substrate; first and second horizontal conductive layers sequentially stacked between the substrate and the gate electrodes; and a channel structure passing through the gate electrodes and extending perpendicularly, and including a channel layer contacting the first horizontal conductive layer, wherein the channel layer has a region having a reduced diameter below a first level in which a lower surface of a lowermost gate electrode is located, among the gate electrodes, and the channel structure further includes a metal silicide region located below the first level and in the channel structure to contact the channel layer.

20 Claims, 30 Drawing Sheets

(51) Int. Cl.
*H10B 43/27* (2023.01)
*H10D 30/67* (2025.01)
*H10D 62/17* (2025.01)
*G11C 16/04* (2006.01)

(52) U.S. Cl.
CPC ....... *H10D 30/6743* (2025.01); *H10D 62/292* (2025.01); *G11C 16/0483* (2013.01)

(56) References Cited

U.S. PATENT DOCUMENTS

| | | |
|---|---|---|
| 10,572,380 B2 | 2/2020 | Li et al. |
| 10,615,170 B2 | 4/2020 | Maeda et al. |
| 10,892,016 B1 | 1/2021 | Or-Bach et al. |
| 11,127,759 B2 * | 9/2021 | Obu .................... H10B 43/27 |
| 2002/0074548 A1 | 6/2002 | Lee et al. |
| 2013/0009235 A1 | 1/2013 | Yoo |
| 2019/0295956 A1 * | 9/2019 | Kawai .................... G11C 16/08 |
| 2020/0144285 A1 | 5/2020 | Lee et al. |
| 2020/0411536 A1 | 12/2020 | Kim et al. |
| 2021/0020652 A1 | 1/2021 | Li |
| 2022/0045091 A1 * | 2/2022 | Cui .................... H01L 29/7926 |

FOREIGN PATENT DOCUMENTS

| | | | | |
|---|---|---|---|---|
| KR | 20150028885 A | * | 3/2015 | ........... H10D 30/693 |
| KR | 10-2020-0052527 A | | 5/2020 | |
| KR | 10-2020-0132790 A | | 11/2020 | |
| KR | 10-2021-0001071 A | | 1/2021 | |

* cited by examiner

SEMICONDUCTOR DEVICES AND DATA STORAGE SYSTEMS INCLUDING THE SAME

CROSS-REFERENCE TO RELATED APPLICATION(S)

This application claims benefit of priority to Korean Patent Application No. 10-2021-0083331 filed on Jun. 25, 2021 in the Korean Intellectual Property Office, the disclosure of which is incorporated herein by reference in its entirety.

BACKGROUND

Inventive concepts relate to a semiconductor device and/or a data storage system including the same.

In an electronic system requiring data storage, a semiconductor device capable of storing high-capacity data may be required or desired. Accordingly, methods for increasing data storage capacity of semiconductor devices are being studied. For example, as a method for increasing data storage capacity of a semiconductor device, a semiconductor device including memory cells arranged three-dimensionally, instead of memory cells arranged two-dimensionally, has been proposed.

SUMMARY

Some example embodiments of inventive concepts provide a semiconductor device having improved reliability and/or electrical characteristics.

Alternatively or additionally, some example embodiments of inventive concepts provide a data storage system including a semiconductor device having improved reliability and/or electrical characteristics.

According to some example embodiments, a semiconductor device includes a substrate; gate electrodes spaced apart from each other and stacked in a first direction perpendicular to an upper surface of the substrate; a first horizontal conductive layer on the substrate and below the gate electrodes; a second horizontal conductive layer on the first horizontal conductive layer and below the gate electrodes; and a channel structure passing through the gate electrodes and in a channel hole extending in the first direction, and including a gate dielectric layer on an inner side surface of and a bottom surface of the channel hole, and a channel layer inside the gate dielectric layer, filling the channel hole, and contacting the first horizontal conductive layer. The channel layer includes a first region adjacent to the first horizontal conductive layer and having a first diameter, a second region on the first region, adjacent to the second horizontal conductive layer, and having a second diameter, and a third region on the second region, adjacent the gate electrodes, and having a third diameter. The second diameter is smaller than the first diameter and the third diameter, and the channel structure further includes a metal silicide region at least partially located in the first region or the second region of the channel layer.

According to some example embodiments, a semiconductor device includes a substrate; gate electrodes spaced apart from each other and stacked in a direction perpendicular to an upper surface of the substrate; first and second horizontal conductive layers sequentially stacked between the substrate and the gate electrodes; and a channel structure passing through the gate electrodes and extending perpendicularly, and including a channel layer contacting the first horizontal conductive layer. The channel layer has a region having a reduced diameter below a first level in which a lower surface of a lowermost one of the gate electrodes is located, and the channel structure further includes a metal silicide region located below the first level and in the channel structure to contact the channel layer.

According to some example embodiments, a data storage system includes a semiconductor storage device including a substrate, circuit elements on one side of the substrate, and an input/output pad electrically connected to the circuit elements; and a controller electrically connected to the semiconductor storage device through the input/output pad and configured to control the semiconductor storage device. The semiconductor storage device further includes: gate electrodes spaced apart from each other and stacked in a direction, perpendicular to an upper surface of the substrate; first and second horizontal conductive layers sequentially stacked between the substrate and the gate electrodes; and a channel structure passing through the gate electrodes and extending perpendicularly, and including a channel layer contacting the first horizontal conductive layer. The channel layer has a region having a reduced diameter below a first level in which a lower surface of a lowermost one of the gate electrodes is located, and the channel structure further includes a metal silicide region located below the first level and in the channel structure to contact the channel layer.

BRIEF DESCRIPTION OF DRAWINGS

The above and other aspects, features, and/or advantages of inventive concepts will be more clearly understood from the following detailed description, taken in conjunction with the accompanying drawings, in which.

DETAILED DESCRIPTION OF VARIOUS EXAMPLE EMBODIMENTS

Hereinafter, various example embodiments of inventive concepts will be described with reference to the accompanying drawings.

Figure 1:
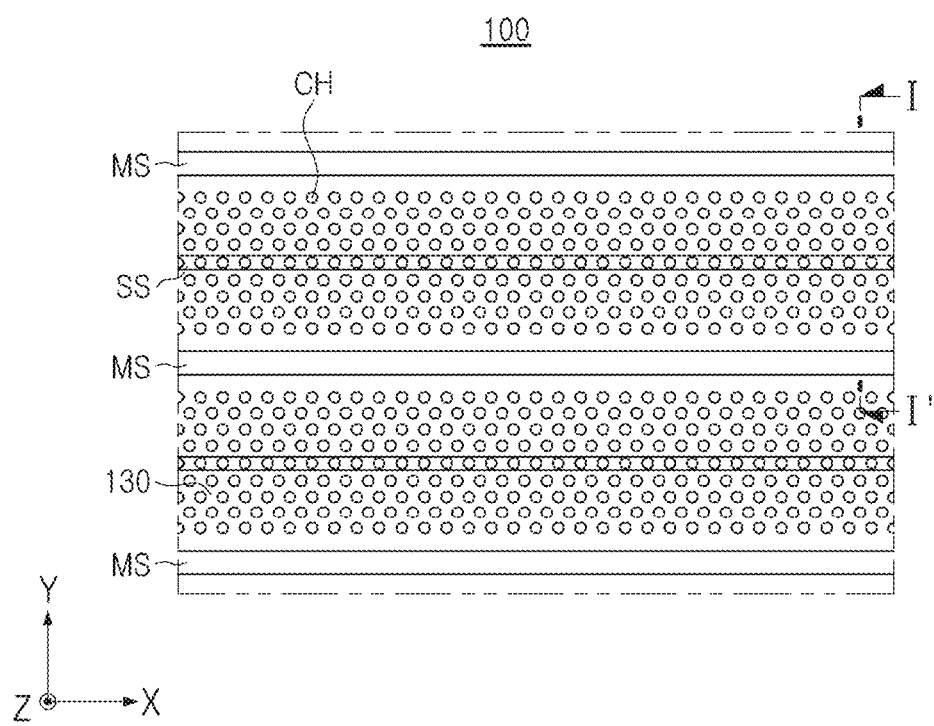
FIG. 1 is a schematic plan view of a semiconductor device according some example embodiments.

FIG. 1 is a schematic plan view of a semiconductor device according some example embodiments.

Figure 2:
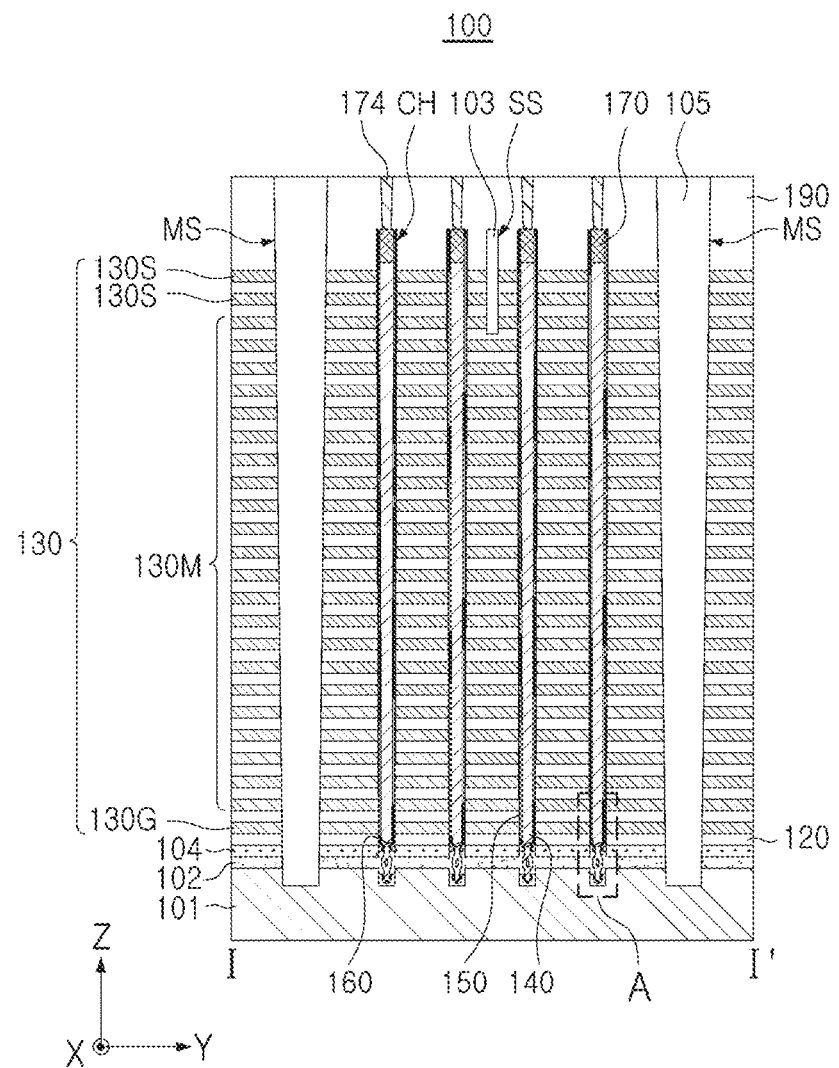
FIG. 2 is a schematic cross-sectional view of a semiconductor device according some example embodiments.

FIG. 2 is a schematic cross-sectional view of a semiconductor device according some example embodiments. FIG. 2 illustrates a cross-sectional view taken along line I-I' of FIG. 1.

Figure 3:
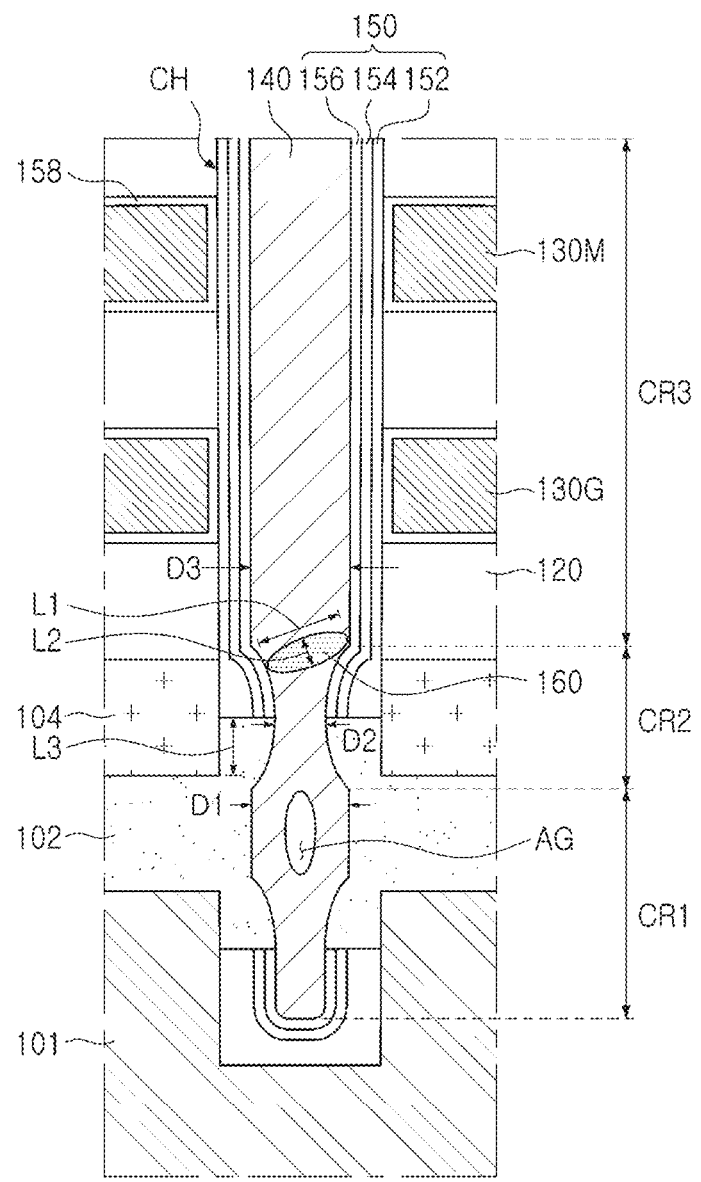
FIG. 3 is a partially enlarged view of a semiconductor device according some example embodiments.

FIG. 3 is a partially enlarged view of a semiconductor device according some example embodiments. FIG. 3 illustrates an enlarged view of portion 'A' of FIG. 2.

Figure 4:
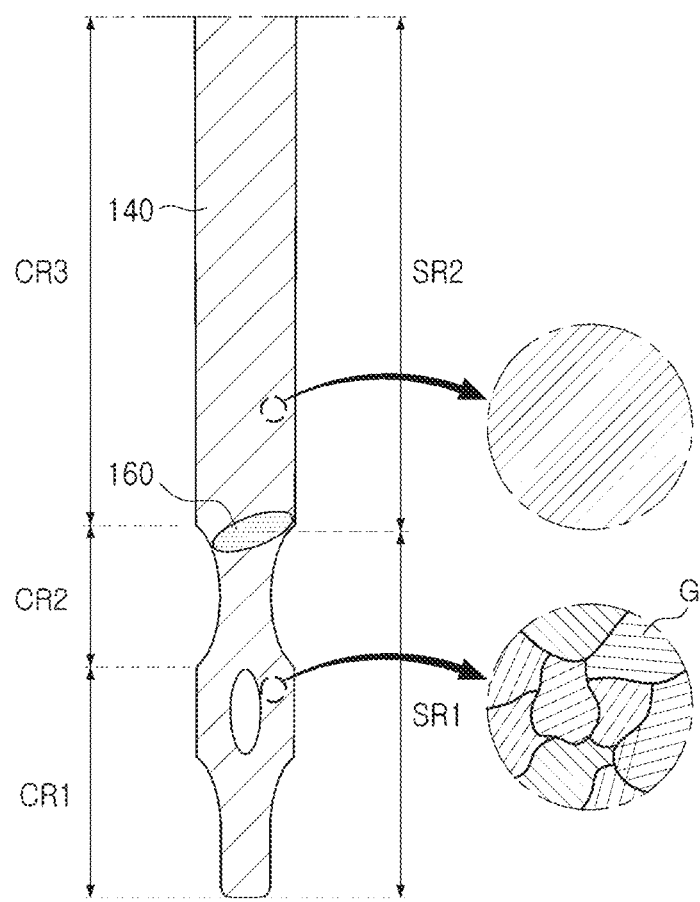
FIG. 4 is a view illustrating a channel layer of a semiconductor device according some example embodiments.

FIG. 4 is a view illustrating a channel layer of a semiconductor device according some example embodiments.

Referring to FIGS. 1 to 3, a semiconductor device 100 may include a substrate 101, first and second horizontal conductive layers 102 and 104 disposed on the substrate 101, gate electrodes 130 stacked on the substrate 101, interlayer insulating layers 120 alternately stacked with the gate electrodes 130 on the substrate 101, channel structures CH disposed to pass through a stack structure of the gate electrodes 130 and respectively including a channel layer 140 and a metal silicide region 160, upper separation regions SS passing through a portion of the stack structure, separation regions MS passing through the stack structure and extending, contact plugs 174 disposed on the channel structures CH, and a cell region insulating layer 190 covering the gate electrodes 130 and the channel structures CH.

In the semiconductor device 100, one memory cell string may be configured around each of the channel structures CH, and a plurality of memory cell strings may be arranged in columns and rows in an X-direction and a Y-direction.

The substrate 101 may have an upper surface extending in the X-direction and the Y-direction. The substrate 101 may be or may include a semiconductor material, for example, a group IV semiconductor, a group III-V compound semiconductor, or a group II-VI compound semiconductor. For example, the group IV semiconductor may include a single-crystal material and may include silicon, germanium, or silicon-germanium. The substrate 101 may be doped, e.g. may be lightly doped with boron; however, example embodiments are not limited thereto. The substrate 101 may be provided as a bulk wafer, an epitaxial layer, a silicon-on-insulator (SOI) layer, a semiconductor-on-insulator (SeOI) layer, or the like.

The first and second horizontal conductive layers 102 and 104 may be stacked on the upper surface of the substrate 101. The first horizontal conductive layer 102 may function as or correspond to at least a portion of a common source line of the semiconductor device 100, and may function, for example, as a common source line together with the substrate 101. Therefore, the first horizontal conductive layer 102 may be referred to as a source conductive layer. As illustrated in the enlarged view of FIG. 3, the first horizontal conductive layer 102 may be connected/directly connected to the channel layer 140, around the channel layer 140. The first horizontal conductive layer 102 may partially extend along the channel layer 140 in a Z-direction to contact the channel layer 140.

The first and second horizontal conductive layers 102 and 104 may include a semiconductor material, such as polycrystalline silicon. Either or both of the first and second horizontal conductive layers 102 and 104 may be doped; however, example embodiments are not limited thereto. In this case, at least the first horizontal conductive layer 102 may be a layer doped with impurities of the same conductivity type as that of the substrate 101. The second horizontal conductive layer 104 may be a doped layer or an intrinsic semiconductor layer, e.g. a layer does not have any further dopants implanted thereon, but may be a layer including impurities diffused from the first horizontal conductive layer 102. A material of the second horizontal conductive layer 104 is not limited to a semiconductor material, and may be replaced with an insulating layer according to some embodiments. In some example embodiments, a relatively thin insulating layer may be interposed between an upper surface of the first horizontal conductive layer 102 and a lower surface of the second horizontal conductive layer 104. This relatively thin insulating layer may be a first horizontal sacrificial layer 111 (refer to FIG. 14A) that remains, without being removed, during an operation manufacturing semiconductor device 100.

The gate electrodes 130 may be vertically spaced apart and stacked on the substrate 101 to form a stack structure. The gate electrodes 130 may include a lower gate electrode 130G forming or corresponding to a gate of a ground select transistor, memory gate electrodes 130M forming or corresponding to a plurality of memory cells, and upper gate electrodes 130S forming or corresponding to gates of string select transistors. The number of memory gate electrodes 130M forming memory cells may be determined according to capacity of the semiconductor device 100. According to some example embodiments, each of the upper and lower gate electrodes 130S and 130G may be one or two or more, and may have the same or different structure as the memory gate electrodes 130M. In some example embodiments, the gate electrodes 130 may further include a gate electrode 130 disposed above the upper gate electrodes 130S and/or below the lower gate electrode 130G, and constituting or included in an erase transistor used in an erase operation using a gate-induced-drain-leakage (GIDL) phenomenon. Alternatively or additionally, some of the gate electrodes 130, for example, the memory gate electrodes 130M adjacent to the upper or lower gate electrodes 130S and 130G may be dummy gate electrodes, e.g. gate electrode that are not electrically active during operation of the semiconductor device 100.

The gate electrodes 130 may include a metal material, for example, tungsten (W). Additionally or alternatively, in some example embodiments, the gate electrodes 130 may include polycrystalline silicon and/or a metal silicide material. In some example embodiments, the gate electrodes 130 may further include a diffusion barrier, for example, and the diffusion barrier may include tungsten nitride (WN), tantalum nitride (TaN), titanium nitride (TiN), or a combination thereof.

The interlayer insulating layers 120 may be disposed between the gate electrodes 130. Like the gate electrodes 130, the interlayer insulating layers 120 may be disposed to be spaced apart from each other in a direction, perpendicular to the upper surface of the substrate 101. The interlayer insulating layers 120 may include an insulating material such as silicon oxide and/or silicon nitride.

Each of the channel structures CH may form one memory cell string, and may be disposed to be spaced apart from each other while forming rows and columns on the substrate 101. The channel structures CH may be disposed to form a grid pattern in an X-Y plane, or may be disposed in a zigzag shape in one direction. The channel structures CH may have a columnar shape that fills a channel hole, and may have inclined side surfaces that become narrower as are closer to the substrate 101 according to an aspect ratio. As illustrated in the enlarged view of FIG. 3, each of the channel structures CH may further include a gate dielectric layer 150 on an outer side surface of the channel layer 140, and a channel pad 170 on an upper end of the channel structure CH, in addition to the channel layer 140 and the metal silicide region 160.

Referring to FIG. 3, the channel layer 140 may have first to third regions CR1, CR2, and CR3, sequentially arranged from the bottom. The first region CR1 may be or include a region adjacent to the first horizontal conductive layer 102, and may be a region surrounded by the first horizontal conductive layer 102 and the substrate 101. The second region CR2 may be or include a region disposed on the first region CR1 and adjacent to the second horizontal conductive layer 104, and may be a region surrounded by the second horizontal conductive layer 104. The second region CR2 may be a region having a level of the second horizontal conductive layer 104, e.g., a height level, and may be a region in which the channel layer 140 has a reduced diameter between the first region CR1 and the third region CR3. The second region CR2 may be located below a level of a lower surface of the lowermost gate electrode 130G. The third region CR3 may be a region disposed on the second region CR2 and adjacent to the gate electrodes 130, and may be a region surrounded by the gate electrodes 130 and the interlayer insulating layers 120.

A boundary between the first region CR1 and the second region CR2 may be located on a level of a lower surface of the second horizontal conductive layer 104, or may be located adjacent to and lower than the level of the lower surface of the second horizontal conductive layer 104. A boundary between the second region CR2 and the third region CR3 may be located on a level of an upper surface of the second horizontal conductive layer 104, or may be located adjacent to and higher than the level of the upper surface of the second horizontal conductive layer 104. In some example embodiments, positions of boundaries of the first to third regions CR1, CR2, and CR3 may be changed according to a diameter of each of the channel structures CH, a thickness of the gate dielectric layer 150, and/or the like.

The channel layer 140 may have a pillar shape and/or a columnar shape and/or a tapered shape to fill the channel hole inside the gate dielectric layer 150. The second region CR2 of the channel layer 140, for example, a region located on a level of the second horizontal conductive layer 104 may have a reduced diameter. The first region CR1 may have a first diameter D1, the second region CR2 may have a second diameter D2, smaller than the first diameter D1, and the third region CR3 may have a third diameter D3, greater than the second diameter D2.

The second region CR2 may have a shape in which a diameter decreases in the Z-direction from an interface with each of the first region CR1 and the third region CR3 to be in contact. The second region CR2 may have a rounded sidewall, and may have a gourd bottle shape, an hourglass shape, and/or a necking shape. The channel layer 140 may have a diameter such as a minimum diameter on a height level between the upper surface and the lower surface of the second horizontal conductive layer 104, and the minimum diameter may correspond to the second diameter D2, for example.

The first region CR1 may have or surround or define an air gap AG therein. The air gap AG may be referred to as a seam. In some example embodiments, at least one of a presence, a size, and location of the air gap AG may be variously changed. The air gap AG may be under pressure; however, example embodiments are not limited thereto. The air gap AG may include air such as clean, dry air; however, example embodiments are not limited thereto. The first region CR1 may have a region of which a width decreases again at a lower end, but a shape of the lower end of the first region CR1 is not limited to the shape illustrated in FIG. 3.

A portion of each of the first region CR1 and the second region CR2 may be connected to/directly connected to the first horizontal conductive layer 102. In a region connected to the first horizontal conductive layer 102, the gate dielectric layer 150 around the channel layer 140 may be removed. A length L3 by which the first horizontal conductive layer 102 extends along the channel layer 140 in an upward direction from the lower surface of the second horizontal conductive layer 104, and a length by which the first horizontal conductive layer 102 extends in a downward direction from the upper surface of the substrate 101 may be variously changed in some example embodiments.

The third region CR3 may extend in an upward direction with a continuously increasing width. For example, the third region CR3 may not have a region of which width is rapidly changed. A profile of a sidewall of the third region CR3 may be significantly straight. The third region CR3 may not include an air gap or a seam therein.

The channel layer 140 may include a semiconductor material such as silicon, and the semiconductor material may be an undoped material or a material including p-type impurities such as boron and/or n-type impurities such as at least one of arsenic or phosphorus. Referring to FIG. 4, a channel layer 140 may be formed of a single material, and a lower region SR1 and an upper region SR2 may have different crystallization degrees. The lower region SR1 of the channel layer 140 including a first region CR1 may have a polycrystalline structure, and the upper region SR2 of the channel layer 140 including a third region CR3 may have a single crystal structure. For example, the lower region SR1 may be formed of polycrystalline silicon including a plurality of grains G. Alternatively, the upper region SR2 may have a single crystal structure including one grain or a single crystal-like structure. The "single crystal-like structure" corresponds to a structure in which at least about 98% thereof has a single crystal structure. Therefore, a size of a grain of the lower region SR1 may be smaller than a size of a grain of the upper region SR2. For example, an average size of a grain of the lower region SR1 may be smaller than an average size of a grain of the upper region SR2. The size of the grains of the lower region SR1 and/or of the upper region SR2 may be determined by various techniques, for example by transmission electron microscopy (TEM) techniques; however, example embodiments are not limited thereto.

The lower region SR1 and the upper region SR2 may be defined based on a metal silicide region 160. The upper region SR2 may have a single crystal structure or a single crystal-like structure, because metal induced lateral crystallization (MILC) may be performed by or from or based on or catalyzed by the metal silicide region 160. The lower region SR1 may have a polycrystalline structure due to crystallization by high temperature, rather than by MILC. According to various example embodiments, a portion of the upper portion in the lower region SR1, contacting the metal silicide region 160, may also have a single crystal structure. The channel layer 140 may include, for example, a single crystal structure at least in the third region CR3 and a polycrystalline structure at least in the first region CR1. Various simulations have confirmed that/shown that, as in example embodiments, when the channel layer 140 has a single crystal structure in most regions, swing characteristics/electrical transition characteristics may be secured or improved even when the channel layer 140 has a pillar shape.

The metal silicide region 160 may be located in the channel structure CH to contact the channel layer 140. For example, at least a portion of the metal silicide region 160 may be located in the second region CR2 of the channel layer 140, as illustrated in FIG. 3. In some example embodiments, the metal silicide region 160 may be located at the boundary between the second region CR2 and the third region CR3, but is not limited thereto. The metal silicide region 160 may be a region in which a metal silicide layer formed on an upper end of the channel layer 140 is diffused and/or moved downward along the channel layer 140, and is collected and/or trapped without or with being inhibited or partially inhibited from moving further in a downward direction due to a reduced thickness of the second region CR2, during a process of fabricating the semiconductor device 100. Upper and lower surfaces of the metal silicide region 160 may be in contact with the channel layer 140. The metal silicide region 160 may further be in contact with a tunneling layer 156.

The metal silicide region 160 may have, for example, a disk shape and/or a rounded disk shape. The metal silicide region 160 may have a shape such as a rectangular shape and/or an elliptical shape, or the like, having a long length in one direction in cross-sectional view. The metal silicide region 160 may have a first length L1 in one direction, for example, along a long axis, and a second length L2, shorter than the first length L1, in a direction, perpendicular thereto. The first length L1 may be greater than the minimum diameter of the channel layer 140, for example, the second diameter D2. The second length L2 may be about 5 Å to about 50 Å (0.5 nm to 5 nm), for example.

The metal silicide region 160 may include a semiconductor element and a metal element. The metal silicide region 160 may include, for example, at least one of nickel silicide (NiSi), titanium silicide (TiSi), cobalt silicide (CoSi), tungsten silicide (WSi), or other metal silicide, where germanium (Ge) and/or silicon germanium (SiGe) may be included, instead of silicon (Si). The metal silicide region 160 may be, for example, nickel silicide represented by $NiSi_2$; however, example embodiments are not limited thereto.

In some example embodiments, the channel layer 140 may be crystallized by the MILC method using the metal silicide region 160. Since the channel layer 140 may have a pillar shape, movement or growth of the metal silicide region 160 may be facilitated. Therefore, the channel layer 140 may have a single crystal structure in most regions including the third region CR3, and thus, electrical characteristics of the semiconductor device 100 may be secured and/or improved. Alternatively or additionally, since the metal silicide region 160 may be collected by the second region CR2 of the channel layer 140, and may be fixed to the lower end of the channel layer 140 and may not further grow into the second region CR2 of the channel layer 140, it may be possible to prevent or reduce the likelihood of and/or impact from a decrease in reliability due to the movement of the metal silicide region 160.

The gate dielectric layer 150 may be disposed between the gate electrodes 130 and the channel layer 140. The gate dielectric layer 150 may be disposed to cover an inner side surface and a bottom surface of the channel hole in which the channel structure CH is disposed. The gate dielectric layer 150 may include a blocking layer 152, a charge storage layer 154, and a tunneling layer 156, sequentially stacked from the gate electrodes 130. The semiconductor device 100 may further include a horizontal blocking layer 158, and the horizontal blocking layer 158 may extend along the gate electrodes 130 in a horizontal direction. The blocking layer 152 may have a first thickness on a side surface of the horizontal blocking layer 158 on the gate electrodes 130 and a side surface of the interlayer insulating layer 120, and may have a second thickness, greater than the first thickness, on a side surface of the second horizontal conductive layer 104 and a surface of the substrate 101. The blocking layer 152 may have, for example, the second thickness in a convex shape, on the side surface of the second horizontal conductive layer 104. Due to such a shape of the blocking layer 152, the second region CR2 of the channel layer 140 may be formed to have a necking structure. The charge storage layer 154 and the tunneling layer 156 may be conformally disposed on the blocking layer 152 to have a substantially uniform thickness, respectively.

The blocking layer 152 and the horizontal blocking layer 158 may include silicon oxide ($SiO_2$), silicon nitride ($Si_3N_4$), silicon oxynitride (SiON), a high-k dielectric material, or a combination thereof. The charge storage layer 154 may be or may include a charge trap layer and/or a floating gate conductive layer. The tunneling layer 156 may tunnel charges into the charge storage layer 154, and may include, for example, silicon oxide ($SiO_2$), silicon nitride ($Si_3N_4$), silicon oxynitride (SiON), or a combination thereof.

The channel pads 170 may be disposed on upper ends of the channel structures CH. The channel pads 170 may be electrically connected to the channel layer 140. The channel pads 170 may include, for example, doped polycrystalline silicon and/or doped single crystalline silicon. For example, the channel pads 170 may be regions having a higher doping concentration than the channel layer 140, but are not limited thereto.

The upper separation regions SS may extend in the X-direction between the separation regions MS adjacent in the Y-direction. The upper separation regions SS may be disposed to pass through a portion of the gate electrodes 130 including an uppermost upper gate electrodes 130S among the gate electrodes 130. As illustrated in FIG. 2, the upper separation regions SS may separate, for example, a total of three gate electrodes 130 from each other in the Y-direction. However, the number of gate electrodes 130 separated by the upper separation regions SS may be variously changed in some example embodiments. The upper separation regions SS may include an upper separation insulating layer 103.

The separation regions MS may pass through the gate electrodes 130, the interlayer insulating layers 120, and the first and second horizontal conductive layers 102 and 104, may extend in the X-direction, and may be connected to the substrate 101. As illustrated in FIG. 1, the separation regions MS may be disposed parallel to each other. The separation regions MS may separate the gate electrodes 130 from each other in the Y-direction. The separation regions MS may have a shape in which a width decreases toward the substrate 101, for example due to a high aspect ratio. The separation regions MS may include a separation insulating layer 105 disposed in a trench.

The contact plugs 174 may be disposed on the channel structures CH. The contact plugs 174 may have a pillar shape, and may have side surfaces, inclined to decrease in width toward the substrate 101 according to an aspect ratio. The contact plugs 174 may electrically connect the channel structures CH to an upper interconnection structure such as bit lines. The contact plugs 174 may be formed of a conductive material, and may include, for example, at least one of tungsten (W), aluminum (Al), or copper (Cu).

The cell region insulating layer 190 may be disposed to cover the gate electrodes 130 and the channel structures CH. The cell region insulating layer 190 may include a plurality of insulating layers according to various example embodiments. The cell region insulating layer 190 may be formed of an insulating material, and may include, for example, at least one of silicon oxide, silicon nitride, or silicon oxynitride.

FIGS. 5A to 5D are partially enlarged views schematically illustrating semiconductor devices according various example embodiments. FIGS. 5A to 5D are enlarged views of a portion corresponding to portion 'A' of FIG. 2.

Figure 5A:
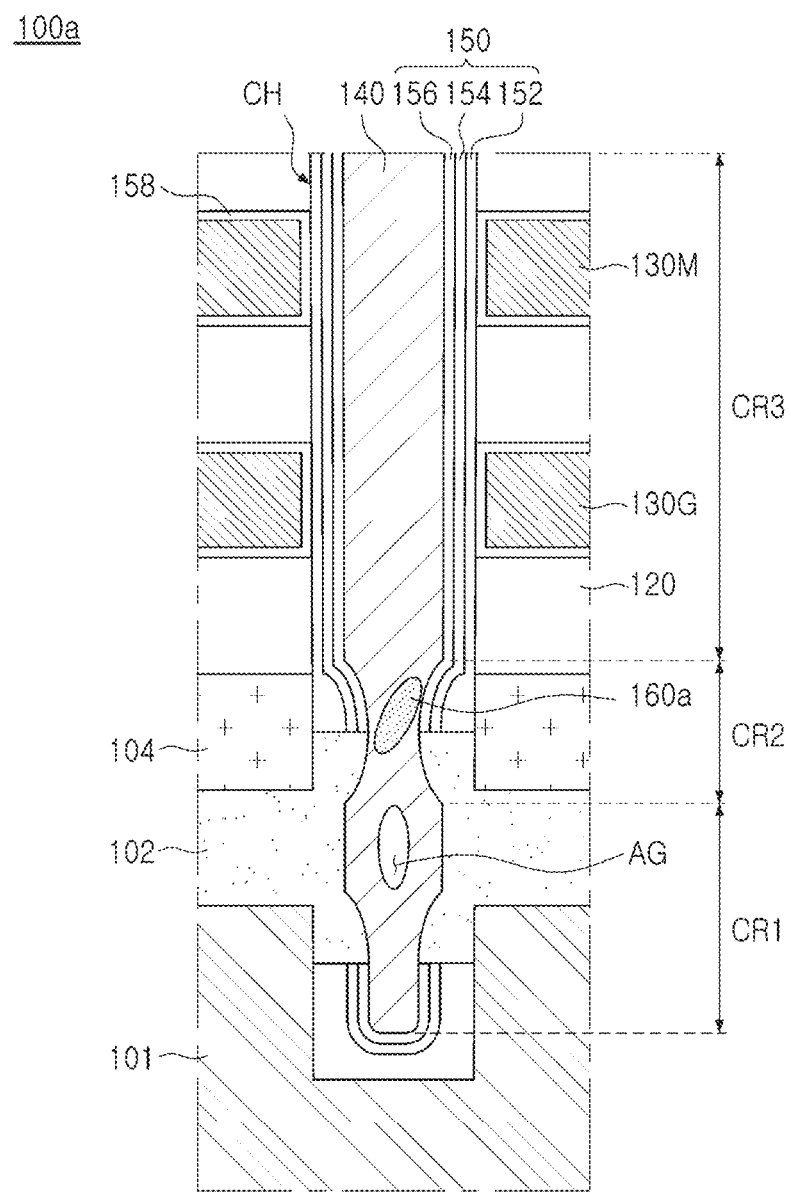
FIGS. 5A to 5D are partially enlarged views schematically illustrating semiconductor devices according some example embodiments.

Referring to FIG. 5A, in a semiconductor device 100*a*, a position of a metal silicide region 160*a* may be different from that in example embodiments as in FIG. 3. Compared to various example embodiments described with reference to FIG. 3, the metal silicide region 160*a* according to example embodiments may be relatively moved further along a channel layer 140 in a downward direction, to be located in a second region CR2.

The metal silicide region 160*a* may be located to span a level on which the channel layer 140 has a minimum diameter. All surfaces of the metal silicide region 160*a* may be in contact with the channel layer 140, and/or may further contact at least one of a tunneling layer 156 or a first horizontal conductive layer 102.

Figure 5B:
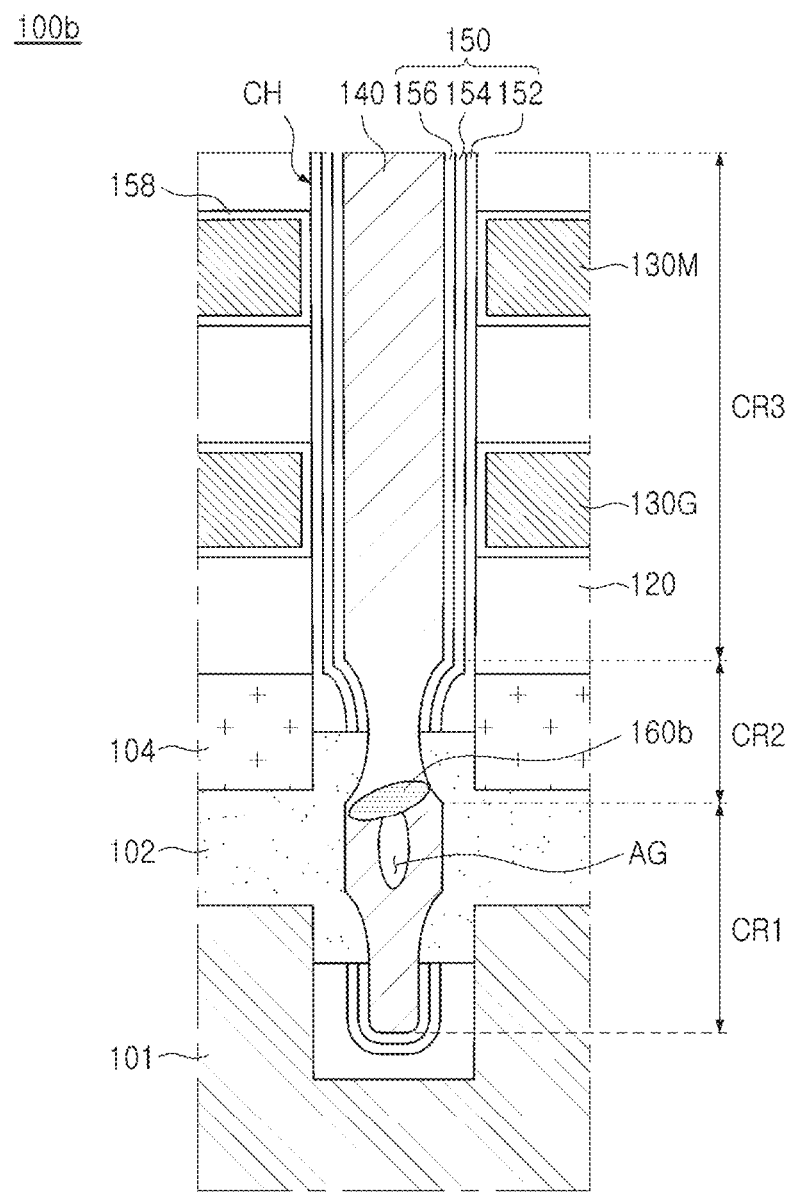

Referring to FIG. 5B, in a semiconductor device 100*b*, a position of a metal silicide region 160*b* may have different features than those described with reference to FIG. 3. For example, the metal silicide region 160*b* may be located adjacent to a boundary between a first region CR1 and a second region CR2.

The metal silicide region 160*b* may be located to contact an air gap AG. For example, the metal silicide region 160*b* may not pass through the air gap AG, and may be located to span the air gap AG. In some example embodiments, the metal silicide region 160*b* may not be in contact with the air gap AG. The metal silicide region 160*b* may have a surface in contact with at least one of a channel layer 140, the air gap AG, or a first horizontal conductive layer 102.

Figure 5C:
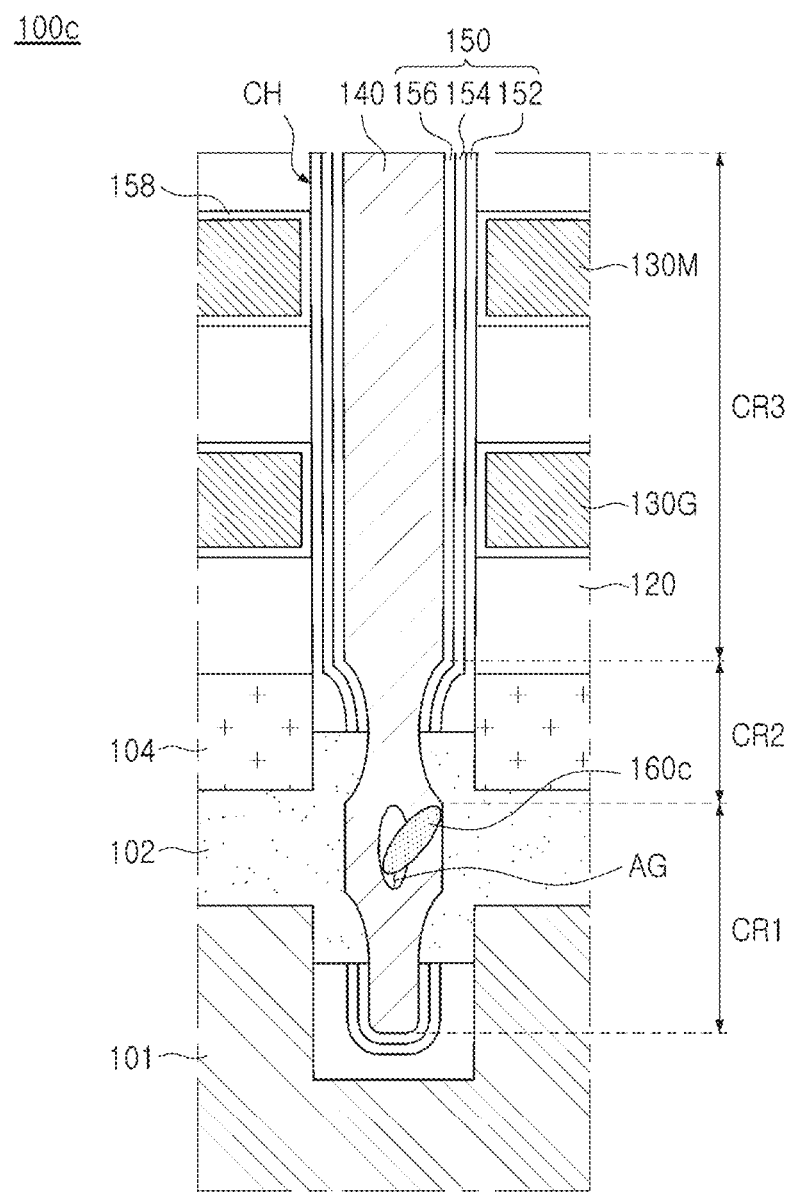

Referring to FIG. 5C, in a semiconductor device 100*c*, a position of a metal silicide region 160*c* may be different from that in example embodiments as in FIG. 3. The metal silicide region 160*c* may be located in a first region CR1.

The metal silicide region 160*c* may be located to span an air gap AG, but is not limited thereto. For example, the metal silicide region 160*c* may be located to have a more erect shape in a channel layer 140 on one side of the air gap AG. Since a width of the channel layer 140 may be relatively narrow on the one side of the air gap AG, the metal silicide region 160*c* may be located, as described above, without moving further in a downward direction. The metal silicide region 160*c* may be located, for example, on a level higher than the upper surface of the substrate 101, but is not limited thereto. The metal silicide region 160*c* may have a surface contacting at least one of the channel layer 140, the air gap AG, or a first horizontal conductive layer 102.

Figure 5D:
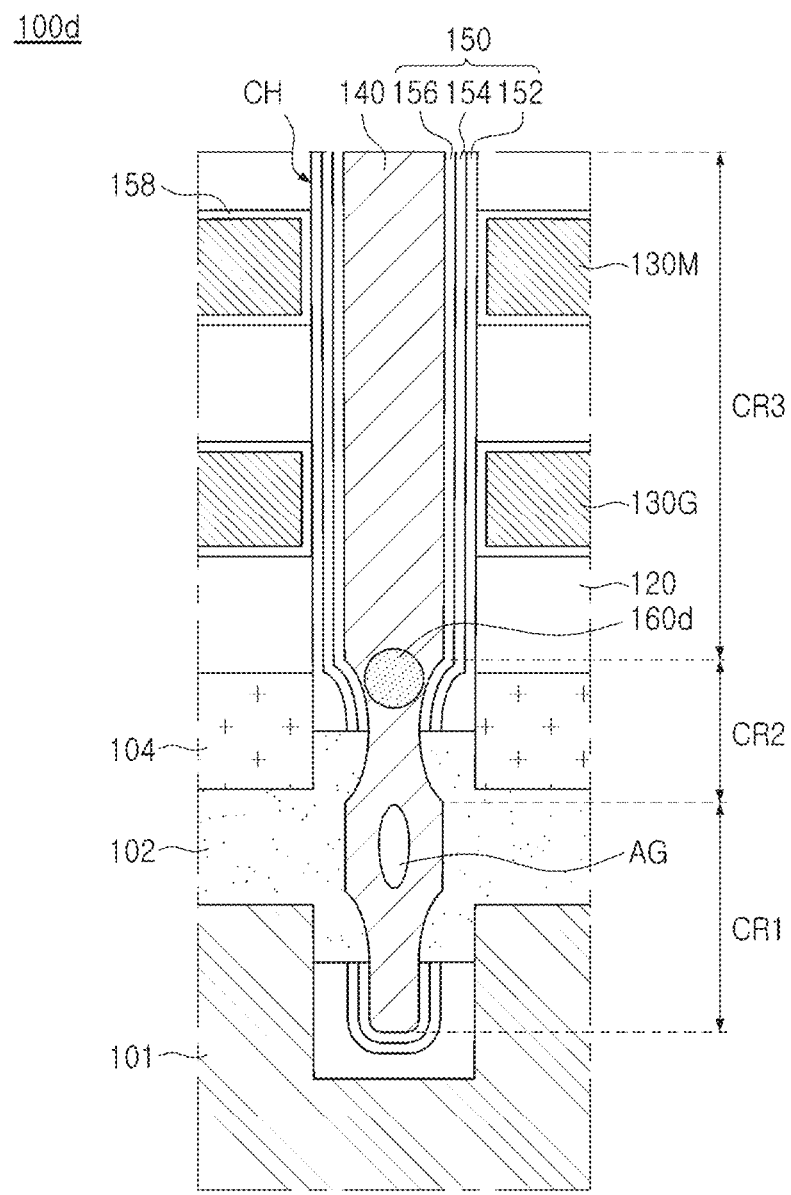

Referring to FIG. 5D, in a semiconductor device 100*d*, a shape of a metal silicide region 160*d* may be different from that of example embodiments as in FIG. 3. The metal silicide region 160*d* may have a shape such as a circular shape, an elliptical shape close to the circular shape, or the like, in cross-sectional view.

For example, the metal silicide region 160*d* may have a disk-shaped three-dimensional shape, and may have a circular shape, an upper surface or a lower surface of a disk in cross-sectional view. Alternatively or additionally, the metal silicide region 160*d* may be formed in a spherical shape according to a process, and thus may have a circular shape even in cross-sectional view. As such, in some example embodiments, the shape of the metal silicide region 160*d* may be variously changed.

Figure 6A:
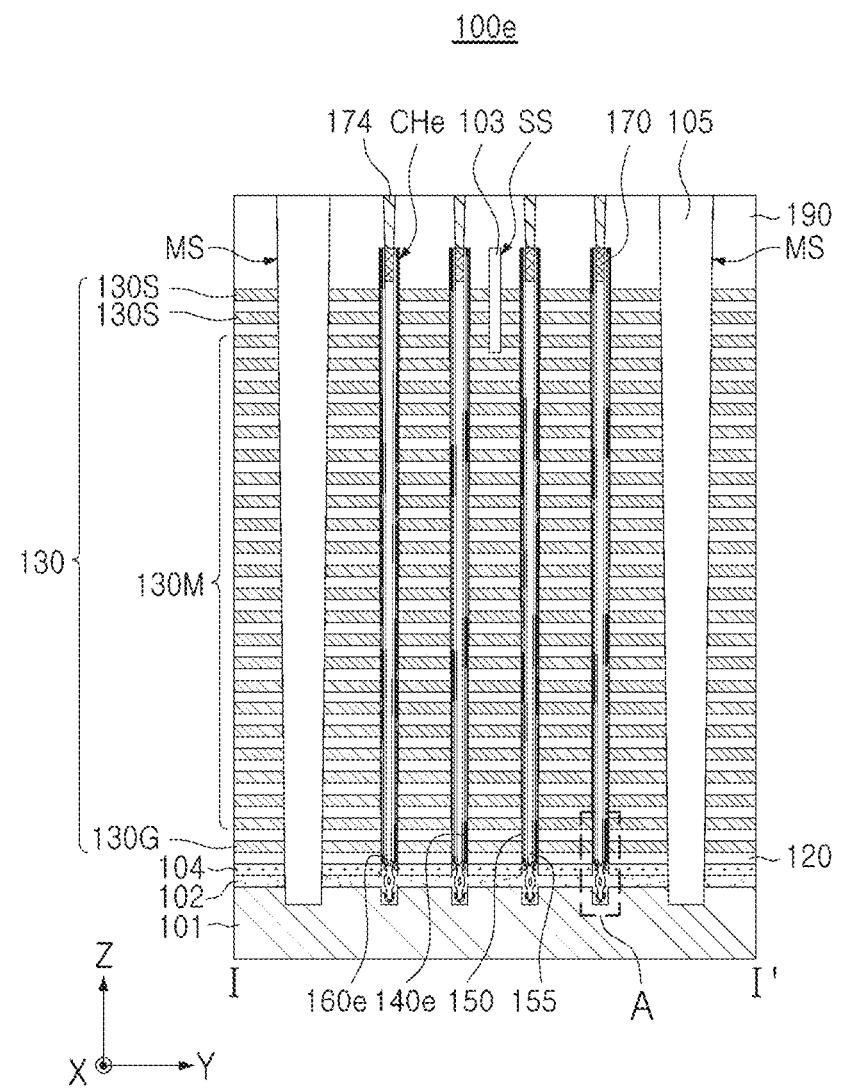
FIGS. 6A and 6B are schematic cross-sectional views and partially enlarged views of semiconductor devices according some example embodiments.
Figure 6B:
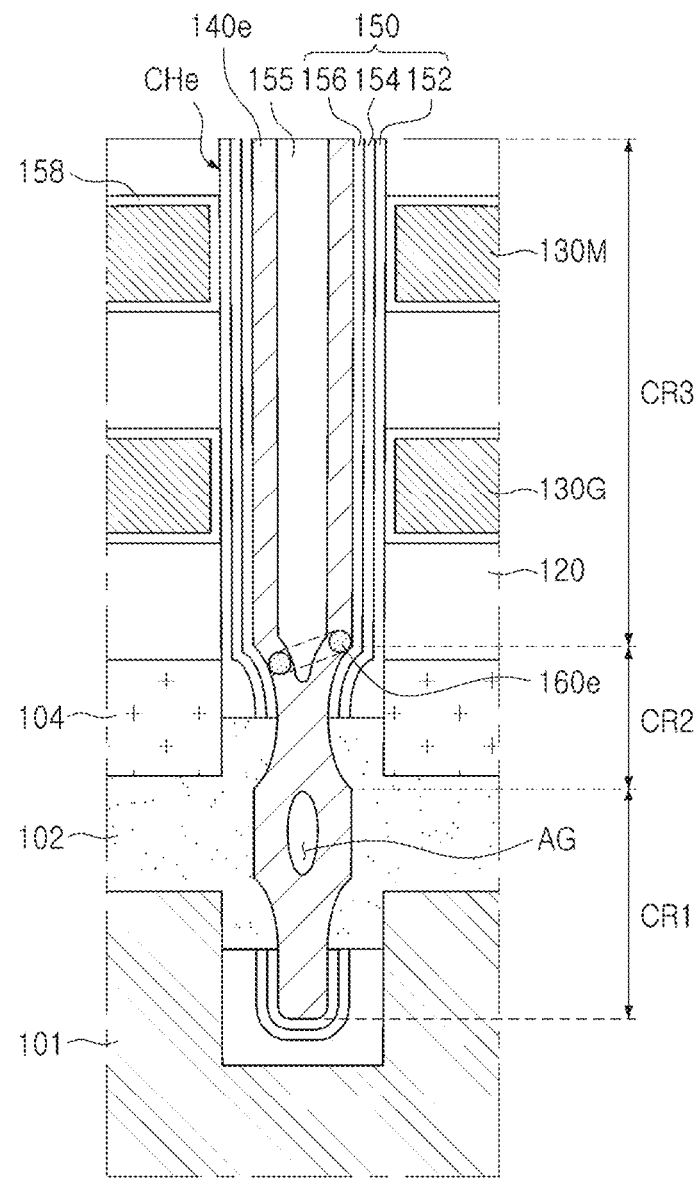

FIGS. 6A and 6B are schematic cross-sectional views and partially enlarged views of semiconductor devices according some example embodiments. FIG. 6B is an enlarged view of portion 'A' of FIG. 6A.

Referring to FIGS. 6A and 6B, in a semiconductor device 100*e*, channel structures CHe may further include a channel buried insulating layer 155. At least a third region CR3 of a channel layer 140*e* may have an annular shape, a macaroni shape, or a cylindrical shape, surrounding the channel buried insulating layer 155 therein. Alternatively or additionally, a metal silicide region 160*e* may have a ring shape corresponding to the channel layer 140*e*.

The channel buried insulating layer 155 may not extend into a first region CR1 and a second region CR2 that are below the third region CR3. Therefore, the first region CR1 and the second region CR2 may have a pillar structure. The structure may be a structure formed, since a diameter of a region in which the channel layer 140*e* is formed may be relatively narrow in the first region CR1 and the second region CR2, and the channel layer 140*e* is thus not conformally formed.

Since the metal silicide region 160*e* may be formed on an upper end of the channel layer 140*e* and may move along the channel layer 140 in a downward direction, the metal silicide region 160*e* may have a shape corresponding to an upper surface of the channel layer 140*e*. The metal silicide region 160*e* may have an annular disk shape and/or a ring shape having annular upper and low surfaces, and may also have a ring shape in cross-sectional view. In some example embodiments, depending on a thickness of the channel layer 140*e*, or the like, the metal silicide region 160*e* may have the same disk shape as the metal silicide region 160 of FIG. 3. In this case, the metal silicide region 160*e* may have a shape such as a rectangular shape, an elliptical shape, or the like, in cross-sectional view.

Figure 7:
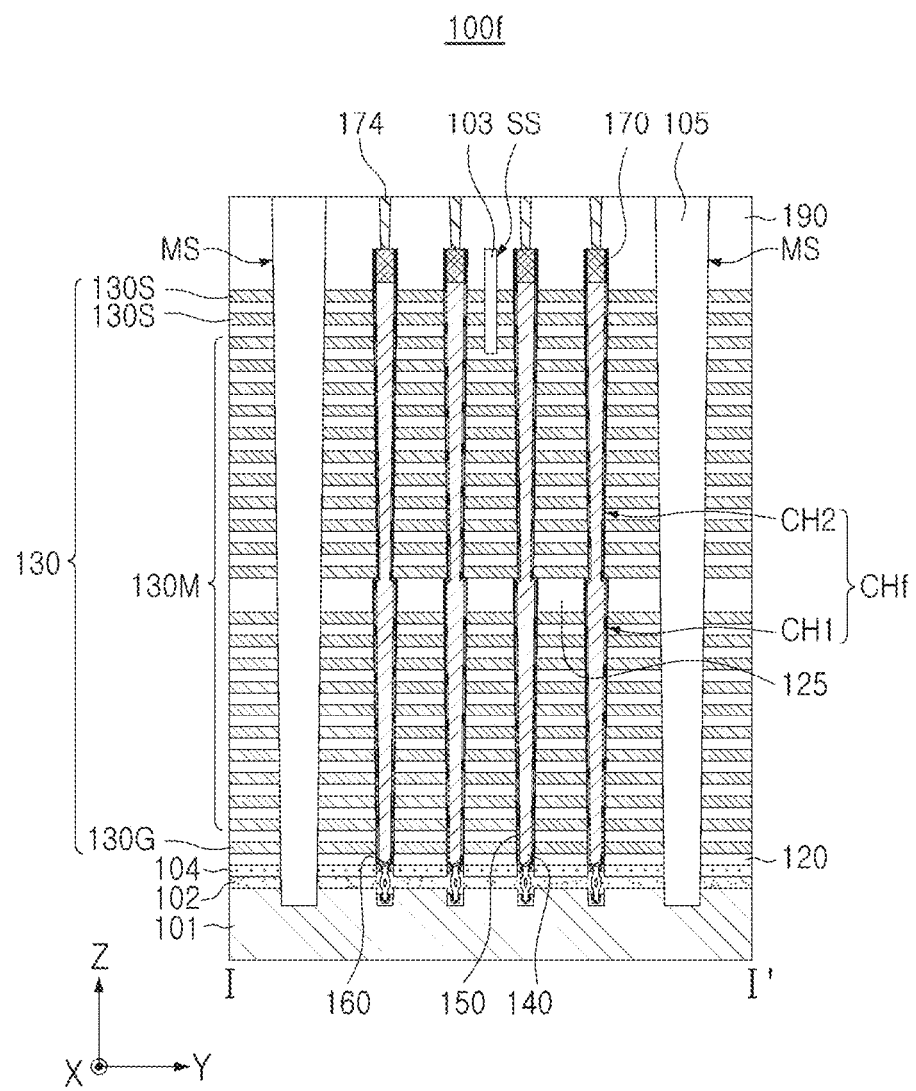
FIG. 7 is a schematic cross-sectional view of a semiconductor device according some example embodiments.

FIG. 7 is a schematic cross-sectional view of a semiconductor device according some example embodiments.

Referring to FIG. 7, a semiconductor device 100*f* may include a stack structure of gate electrodes 130 formed of lower and upper stack structures vertically stacked, and may include first and second channel structures CH1 and CH2 in which channel structures CHf are vertically stacked. The channel structures CHf may be introduced to stably form the channel structures CHf, when the number of the gate electrodes 130 stacked relatively is large. According to some embodiments, the number of stacked channel structures may be variously changed.

The channel structures CHf may have a shape in which the first channel structures CH1, a lower portion, and the second channel structures CH2, an upper portion, may be connected to each other, and may have a bend portion due to a difference in width in a connection region. A channel layer 140 and a gate dielectric layer 150 may be connected to each other between the first channel structure CH1 and the second channel structure CH2. A channel pad 170 may be disposed only on an upper end of the second channel structure CH2, the upper portion. In some example embodiments, the first channel structure CH1 and the second channel structure CH2 may include the channel pad 170, respectively. In this case, the channel pad 170 of the first channel structure CH1 may be connected to the channel layer 140 of the second channel structure CH2. Also, a metal silicide region 160 may be located a lower portion of the first channel structure CH1.

An upper interlayer insulating layer 125 having a relatively thick thickness may be disposed on an uppermost portion of the lower stack structure. Shapes of the interlayer insulating layers 120 and a shape of the upper interlayer insulating layer 125 may be variously changed in various example embodiments. As such, shapes of the plurality of stacked channel structures CHf may be applied to various other embodiments. A number of memory gate electrodes 130M above the upper interlayer insulating layer 125 may be the same as, greater than, or less than a number of memory gate electrodes 130M below the upper insulating layer 125.

Figure 8:
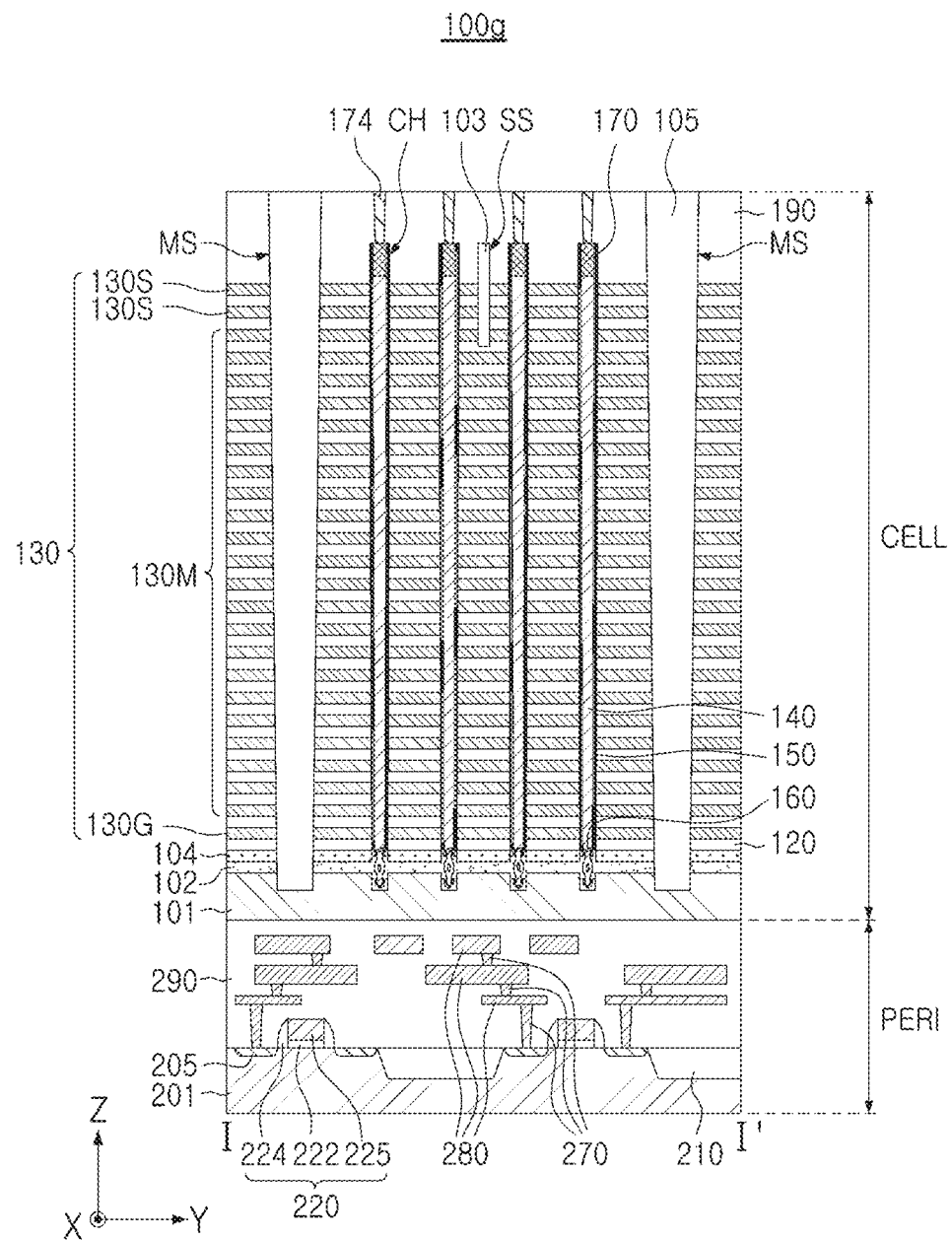
FIG. 8 is a schematic cross-sectional view of a semiconductor device according some example embodiments.

FIG. 8 is a schematic cross-sectional view of a semiconductor device according some example embodiments.

Referring to FIG. 8, a semiconductor device 100g may include a memory cell region CELL and a peripheral circuit region PERI, stacked vertically. The memory cell region CELL may be disposed on the peripheral circuit region PERI. For example, in the semiconductor device 100 of FIG. 2, the peripheral circuit region PERI may be disposed on a substrate 101 in a region not illustrated, or the peripheral circuit region PERI may be disposed below the substrate 101, as in the semiconductor device 100g of example embodiments. In example embodiments, the cell region CELL may be disposed below the peripheral circuit region PERI. For description of the memory cell region CELL, the descriptions with reference to FIGS. 1 to 4 may be equally applied.

The peripheral circuit region PERI may include a base substrate 201, circuit elements 220 disposed on the base substrate 201, circuit contact plugs 270, and circuit wiring lines 280.

The base substrate 201 may have an upper surface extending in the X-direction and the Y-direction. Device isolation layers 210 may be formed on the base substrate 201 to define an active region. Source/drain regions 205 including impurities may be disposed in a portion of the active region. The base substrate 201 may include a semiconductor material, for example, a group IV semiconductor, a group III-V compound semiconductor, or a group II-VI compound semiconductor. The base substrate 201 may be provided as a bulk wafer and/or an epitaxial layer. In some example embodiments, the substrate 101 in the upper portion may be provided as a polycrystalline semiconductor layer such as a polycrystalline silicon layer, or an epitaxial layer.

The circuit elements 220 may include active and/or passive elements, and may include three-dimensional and/planar transistors. Each of the circuit elements 220 may include a circuit gate dielectric layer 222, a spacer layer 224, and a circuit gate electrode 225. Source/drain regions 205 may be disposed in the base substrate 201 on both sides of the circuit gate electrode 225.

A peripheral region insulating layer 290 may be disposed on the circuit element 220 on the base substrate 201. The circuit contact plugs 270 may pass through the peripheral region insulating layer 290 to be connected to the source/drain regions 205. An electrical signal may be applied to the circuit element 220 by the circuit contact plugs 270. In a region not illustrated, the circuit contact plugs 270 may also be connected to the circuit gate electrode 225. The circuit wiring lines 280 may be connected to the circuit contact plugs 270, and may be arranged as a plurality of layers.

In the semiconductor device 100g, after the peripheral circuit region PERI is first prepared, the substrate 101 of the memory cell region CELL may be formed thereon to prepare the memory cell region CELL. The substrate 101 may have the same size as the base substrate 201, or may be formed to have a size that is different from, e.g., smaller than the base substrate 201. The memory cell region CELL and the peripheral circuit region PERI may be connected to each other in a region not illustrated. For example, one end of a gate electrode 130 in the Y-direction may be electrically connected to the circuit elements 220. A configuration in which the memory cell region CELL and the peripheral circuit region PERI are vertically stacked may be applied to other embodiments.

Figure 9:
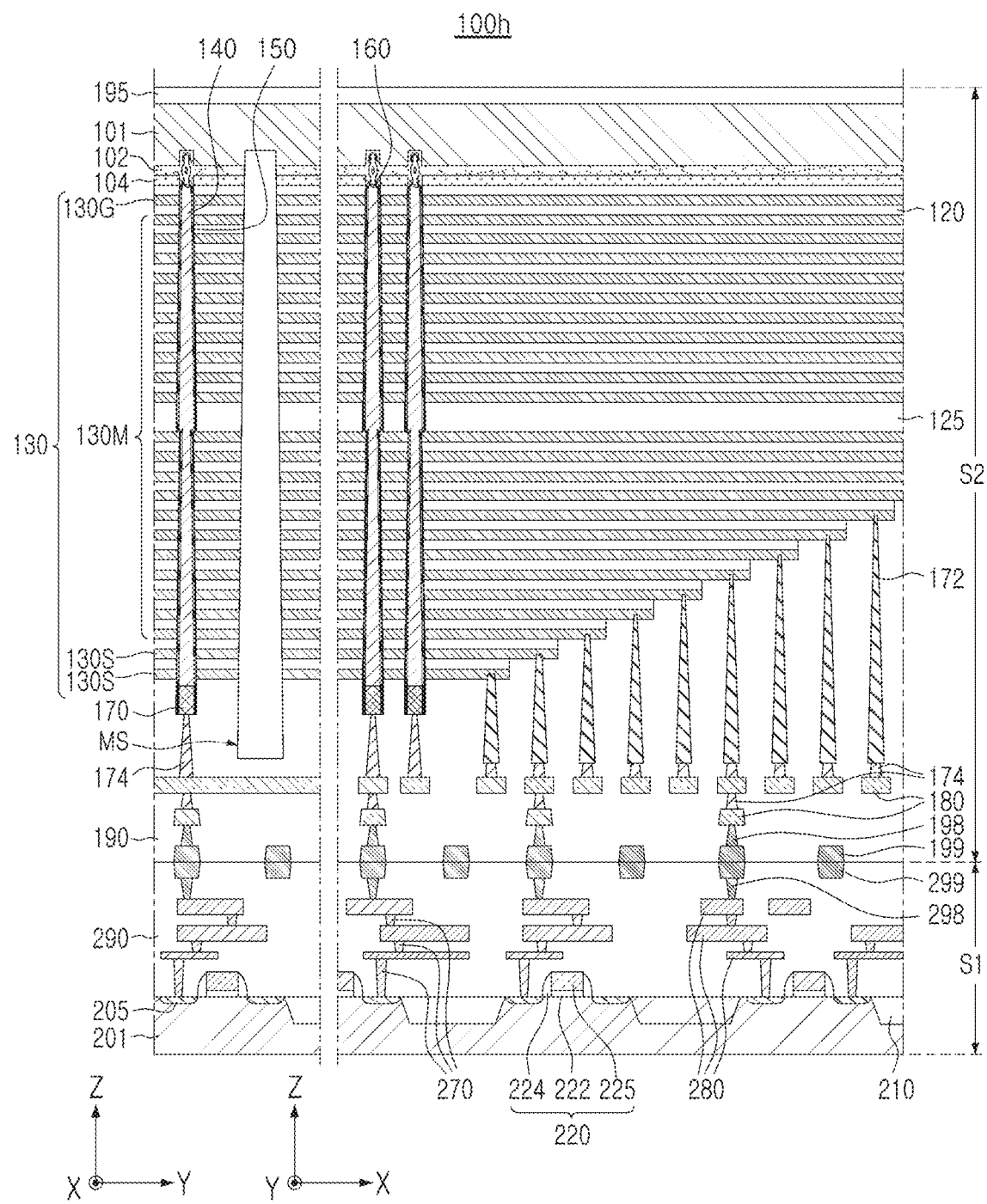
FIG. 9 is a schematic cross-sectional view of a semiconductor device according some example embodiments.

FIG. 9 is a schematic cross-sectional view of a semiconductor device according some example embodiments.

Referring to FIG. 9, a semiconductor device 100h may include a first semiconductor structure S1 and a second semiconductor structure S2, bonded by a wafer bonding method.

The description of the peripheral circuit region PERI described above with reference to FIG. 8 may be applied to the first semiconductor structure S1. The first semiconductor structure S1 may further include first bonding vias 298 and first bonding pads 299, which may be bonding structures. The first bonding vias 298 may be disposed on uppermost circuit wiring lines 280 to be connected to circuit wiring lines 280. At least a portion of the first bonding pads 299 may be disposed on the first bonding vias 298 and may be connected to the first bonding vias 298. The first bonding pads 299 may be connected to second bonding pads 199 of the second semiconductor structure S2. The first bonding pads 299 together with the second bonding pads 199 may provide an electrical connection path according to a bonding between the first semiconductor structure S1 and the second semiconductor structure S2. The first bonding vias 298 and the first bonding pads 299 may include a conductive material, for example, copper (Cu).

For the second semiconductor structure S2, the descriptions with reference to FIGS. 1 to 4 may be equally applied, unless otherwise described. The second semiconductor structure S2 may further include gate contacts 172, contact plugs 174, and cell wiring lines 180, which may be wiring structures, and may further include second bonding vias 198 and second bonding pads 199, which may be bonding structures. The second semiconductor structure S2 may further include a protective layer 195 covering an upper surface of a substrate 101.

The gate contacts 172 may pass through a cell region insulating layer 190 to be connected to gate electrodes 130. The contact plugs 174 may be disposed below the gate contacts 172 and channel structures CH, and may connect the gate contacts 172 to the channel structures CH and the cell wiring lines 180, or may connect the cell wiring lines 180. In some example embodiments, the number of layers and/or arrangement of contacts and wiring lines constituting a wiring structure may be variously changed. The gate contacts 172, the contact plugs 174, and the cell wiring lines 180 may be formed of a conductive material, and may include at least one of tungsten (W), aluminum (Al), or copper (Cu), for example.

The second bonding vias 198 and the second bonding pads 199 may be disposed below lowermost cell wiring lines 180. The second bonding vias 198 may be connected to the cell wiring lines 180 and the second bonding pads 199, and the second bonding pads 199 may be bonded to the first bonding pads 299 of the first semiconductor structure S1. The second bonding vias 198 and the second bonding pads 199 may include a conductive material, for example, copper (Cu).

The first semiconductor structure S1 and the second semiconductor structure S2 may be to be bonded by copper (Cu)-to-copper (Cu) bonding by the first bonding pads 299 and the second bonding pads 199. In addition to the copper (Cu)-to-copper (Cu) bonding, the first semiconductor structure S1 and the second semiconductor structure S2 may be additionally or alternatively bonded by dielectric-to-dielectric bonding. The dielectric-to-dielectric bonding may be a bonding method by dielectric layers forming a portion of each of the peripheral region insulating layer 290 and the cell region insulating layer 190, and surrounding each of the first bonding pads 299 and the second bonding pads 199, respectively. Therefore, the first semiconductor structure S1 and the second semiconductor structure S2 may be bonded without a separate adhesive layer.

FIGS. 10 to 17 are schematic cross-sectional views illustrating a method of manufacturing a semiconductor device according to some example embodiments. FIGS. 10, 11A, 12A, 13A, 14A, 15A, 16A, and 17 illustrate regions corresponding to the region illustrated in FIG. 2. FIGS. 11B, 12B, 14B, 15B, and 16B are enlarged views of portion 'A' of FIGS. 11A, 12A, 14A, 15A, and 16A, respectively, and FIG. 13B is an enlarged view of portion 13' of FIG. 13A.

Figure 10:
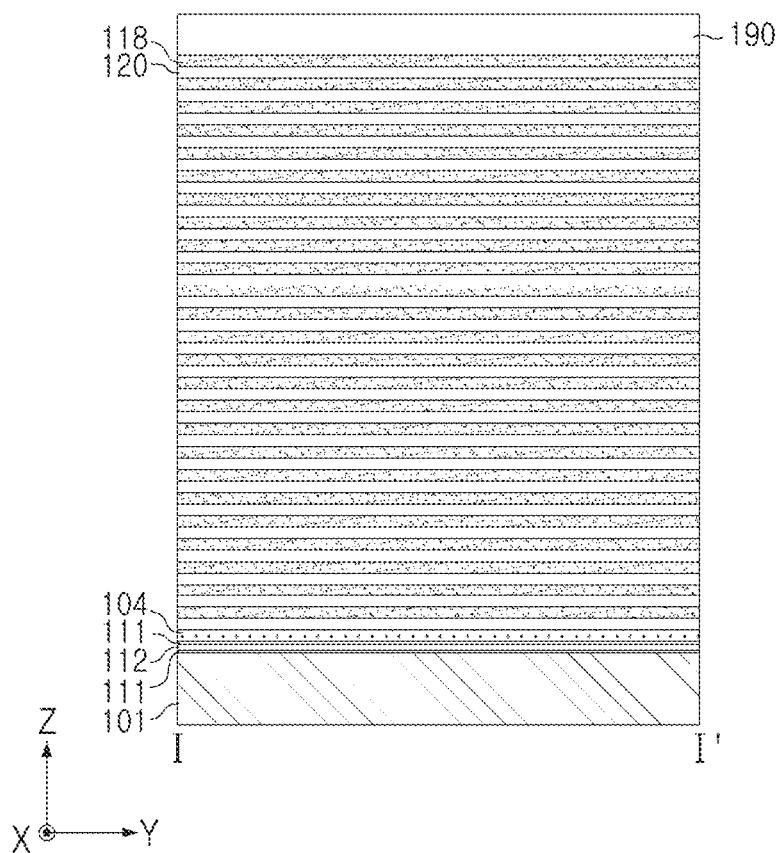
FIGS. 10 to 17 are schematic cross-sectional views illustrating a method of manufacturing a semiconductor device according some example embodiments.

Referring to FIG. 10, first and second horizontal sacrificial layers 111 and 112 and a second horizontal conductive layer 104 may be formed on a substrate 101, and sacrificial insulating layers 118 and interlayer insulating layers 120 may be alternately stacked. A thickness of each of or any of the sacrificial layers 118 may be the same as, or different from each other, and/or a thickness of or any of the interlayer insulating layers 120 may be the same as, or different from each other, and may be the same as, or different from, a corresponding thickness of the sacrificial layers 118.

The first and second horizontal sacrificial layers 111 and 112 may be stacked on the substrate 101 such that the first horizontal sacrificial layers 111 are disposed above and below the second horizontal sacrificial layer 112. The first and second horizontal sacrificial layers 111 and 112 may include different materials, and may or may not include any common material. The first and second horizontal sacrificial layers 111 and 112 may be layers replaced with a first horizontal conductive layer 102 (refer to FIG. 2) by a subsequent process. For example, the first horizontal sacrificial layer 111 may be formed of the same material as the interlayer insulating layers 120, and the second horizontal sacrificial layer 112 may be formed of the same material as the sacrificial insulating layers 118. The second horizontal conductive layer 104 may be formed on the first and second horizontal sacrificial layers 111 and 112.

The sacrificial insulating layers 118 may be partially replaced with a gate electrodes 130 (refer to FIG. 2) by a subsequent process. The sacrificial insulating layers 118 may be formed of a material different from that of the interlayer insulating layers 120, and may be formed of a material that may be etched with etching selectivity for the interlayer insulating layers 120 under specific etching conditions. For example, the interlayer insulating layer 120 may be formed of at least one of silicon oxide or silicon nitride, and the sacrificial insulating layers 118 may be formed of a material selected from silicon, silicon oxide, silicon carbide, and silicon nitride, which is different from that of the interlayer insulating layer 120. In some example embodiments, thicknesses of the interlayer insulating layers 120 may not all be the same. Thicknesses of the interlayer insulating layers 120 and the sacrificial insulating layers 118, and the number of films constituting the interlayer insulating layers 120 and the sacrificial insulating layers 118 may be variously changed from those illustrated.

Next, a cell region insulating layer 190 covering a stack structure of the sacrificial insulating layers 118 and the interlayer insulating layers 120 may be partially formed.

Figure 11A:
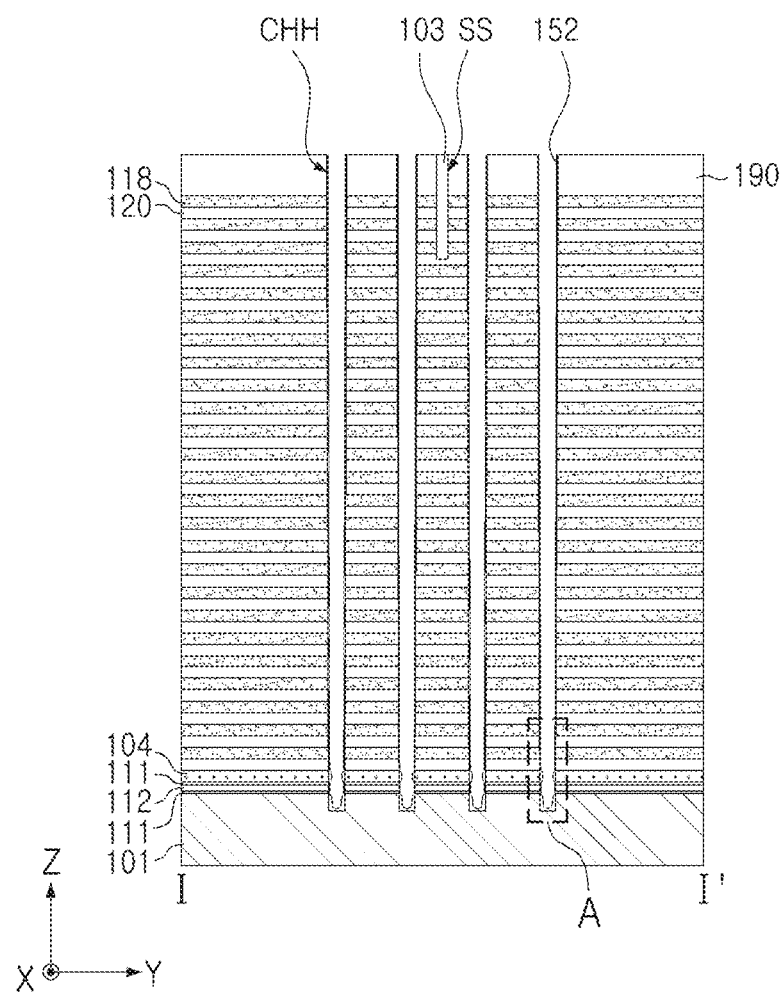
Figure 11B:
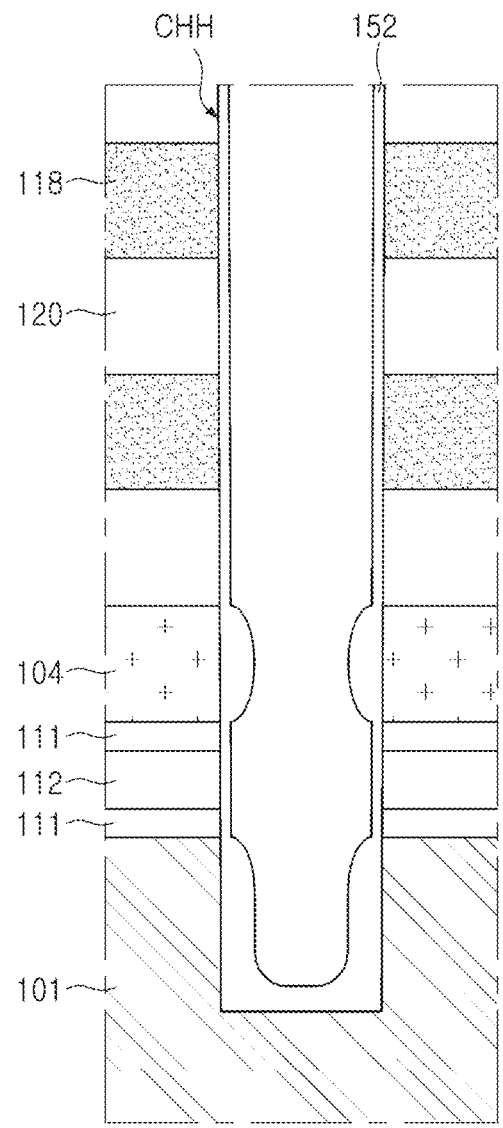

Referring to FIGS. 11A and 11B, channel holes CHH passing through the stack structure of the sacrificial insulating layers 118 and the interlayer insulating layers 120 may be formed, and a blocking layer 152 may be formed in the channel holes CHH.

First, portions of the sacrificial insulating layers 118 and the interlayer insulating layers 120 may be removed to form upper separation regions SS. A region in which the upper separation regions SS are formed may be exposed using a separate mask layer, a variably determined or predetermined number of sacrificial insulating layers 118 and a variably determined or predetermined number of interlayer insulating layers 120 may be removed from the top, and an insulating material may be deposited to form an upper separation insulating layer 103.

The channel holes CHH may be formed by etching, e.g. by anisotropically etching the sacrificial insulating layers 118 and the interlayer insulating layers 120 using a mask layer. The etching may be dry-etching with a plasma process; however, example embodiments are not limited thereto. Due to a height of the stack structure, sidewalls of the channel holes CHH may not be perpendicular to an upper surface of the substrate 101. The channel holes CHH may be formed to recess a portion of the substrate 101.

Next, the blocking layer 152 may be formed in/within the channel holes CHH. The blocking layer 152 may be formed to have a uniform thickness using an atomic layer deposition (ALD) process and/or a chemical vapor deposition (CVD) process. The blocking layer 152 may be formed to be relatively thick on a side surface of the second horizontal conductive layer 104, as compared to being formed on side surfaces of the sacrificial insulating layers 118, on side surfaces of the interlayer insulating layers 120, and on side surfaces of the first and second horizontal sacrificial layers 111 and 112. A thickness of a deposition process and/or an oxidation process may be based on a material composition of each of the first and second horizontal layers 111 and 112, along with a material composition of the second horizontal conductive layer 104 and/or the substrate 101. Therefore, in a region adjacent to the second horizontal conductive layer 104 or a region surrounded by the second horizontal conductive layer 104, diameters of the channel holes CHH may be relatively small.

Exposed side surface of the second horizontal conductive layer 104 partially oxidized by a process such as a thermal oxidation process, for example, to form a portion of the blocking layer 152. In some example embodiments, the thermal oxidation process may be performed after, for example, a polycrystalline silicon layer and/or a silicon nitride layer is formed. As the second horizontal conductive layer 104 is partially oxidized, the side surface of the second horizontal conductive layer 104 may be located outwardly based on the channel holes CHH, compared to the side surfaces of the interlayer insulating layers 120 and the side surfaces of the sacrificial insulating layers 118.

A process such as a pretreatment process may be performed, together with or instead of the thermal oxidation process, to differently adjust adsorption force of a precursor for forming the blocking layer 152, to allow the blocking layer 152 to be relatively thick on a silicon layer. Therefore, the blocking layer 152 may be formed to be relatively thick on the second horizontal conductive layer 104 and the substrate 101, exposed through the channel hole CHH.

Figure 12A:
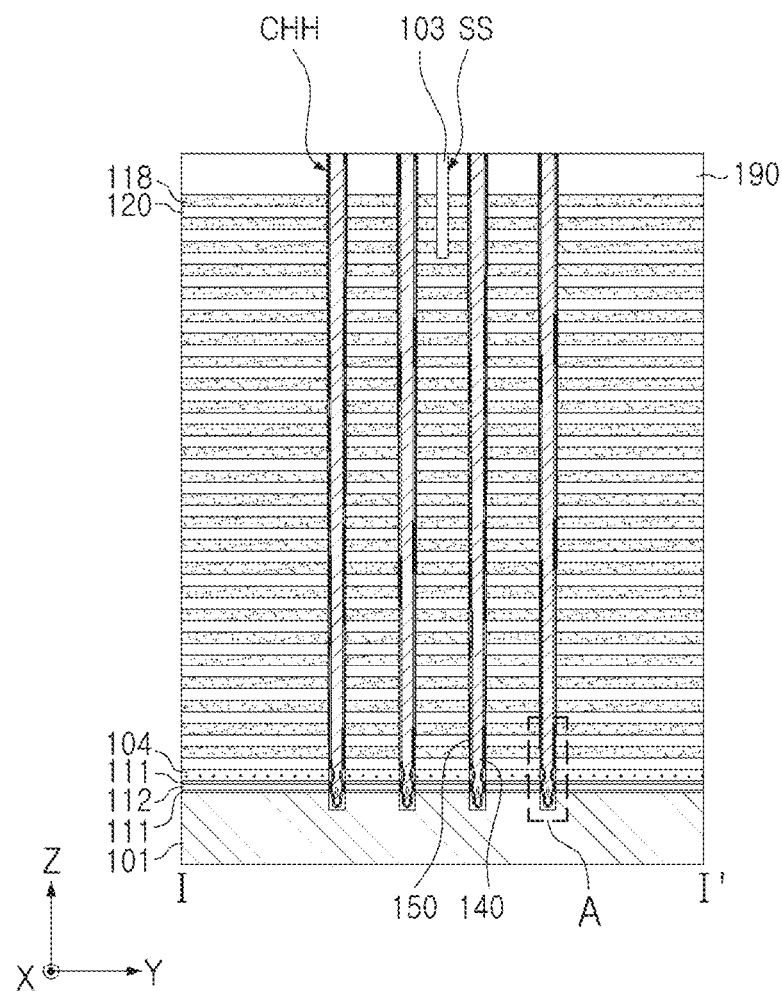
Figure 12B:
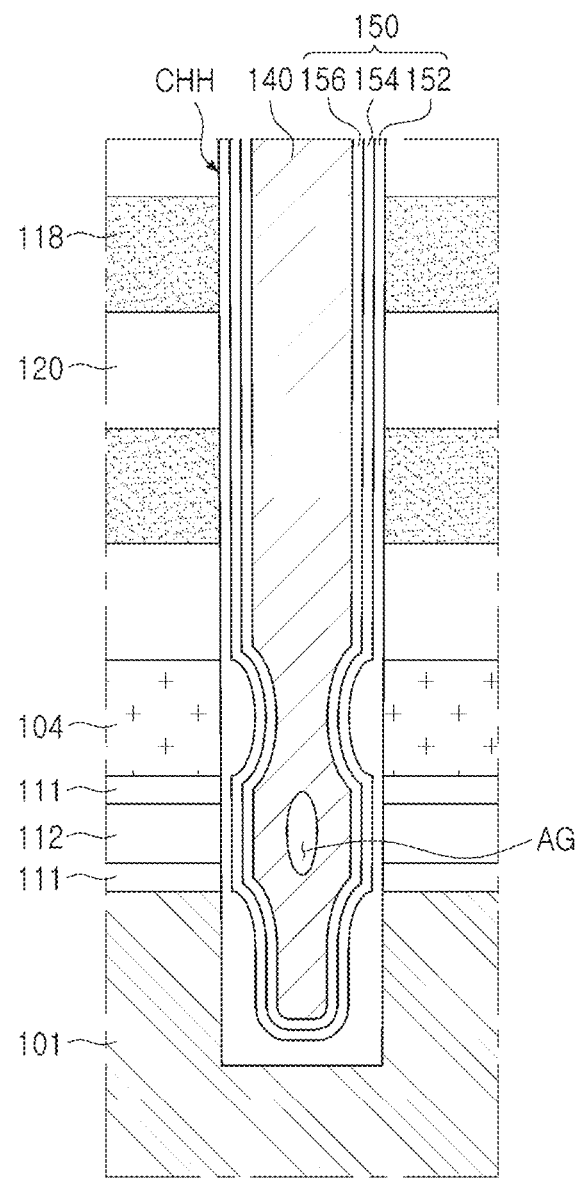

Referring to FIGS. 12A and 12B, a charge storage layer 154, a tunneling layer 156, and a channel layer 140 may be formed in the channel holes CHH.

The charge storage layer 154 and the tunneling layer 156 may be conformally formed on the blocking layer 152 to have a substantially uniform thickness. Therefore, a gate dielectric layer 150 may be formed.

The channel layer 140 may be formed to fill the channel holes CHH. In this operation, the channel layer 140 may be formed as an amorphous structure such as amorphous silicon, and may be doped or undoped. The channel layer 140 may be formed in a pillar shape in which a seam is not formed, on the second horizontal conductive layer 104. For example, the channel layer 140 may be formed without a seam by forming the channel layer 140 under a hydrogen (H$_2$) atmosphere using a silane precursor having a halogen group. Since a diameter in a region adjacent to the second horizontal conductive layer 104 is relatively small, the channel layer 140 may be formed to fill a region surrounding by the second horizontal conductive layer 104 in a state that does not completely fill a region below the second horizontal conductive layer 104. Therefore, an air gap AG may be formed in a lower portion of the channel layer 140.

Figure 13A:
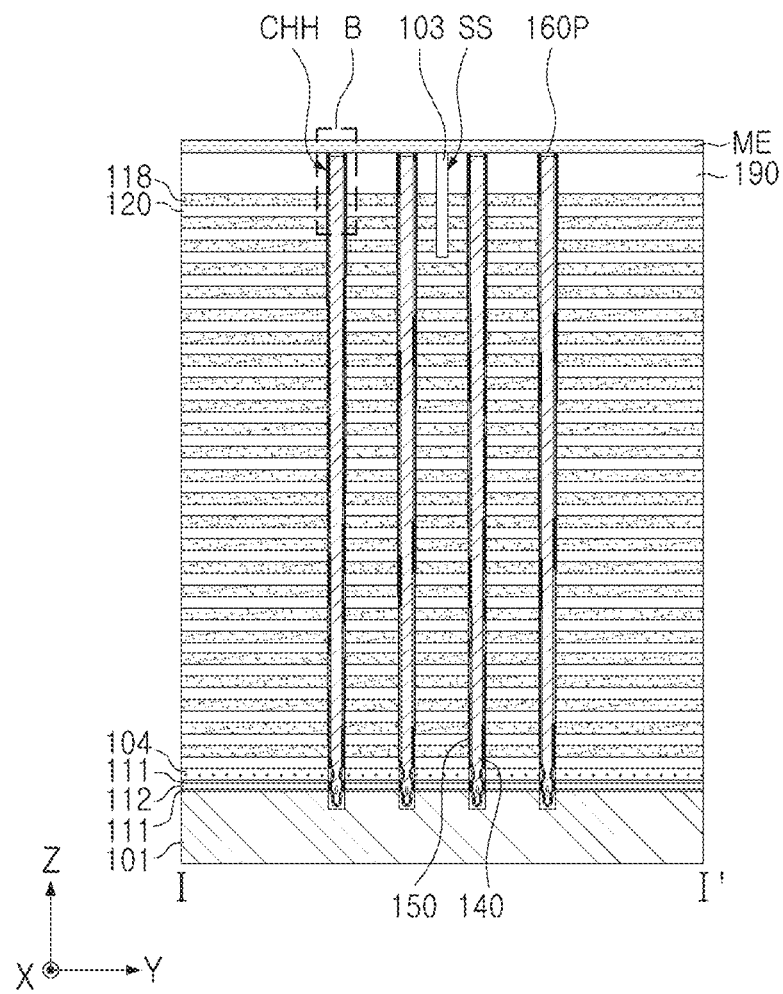
Figure 13B:
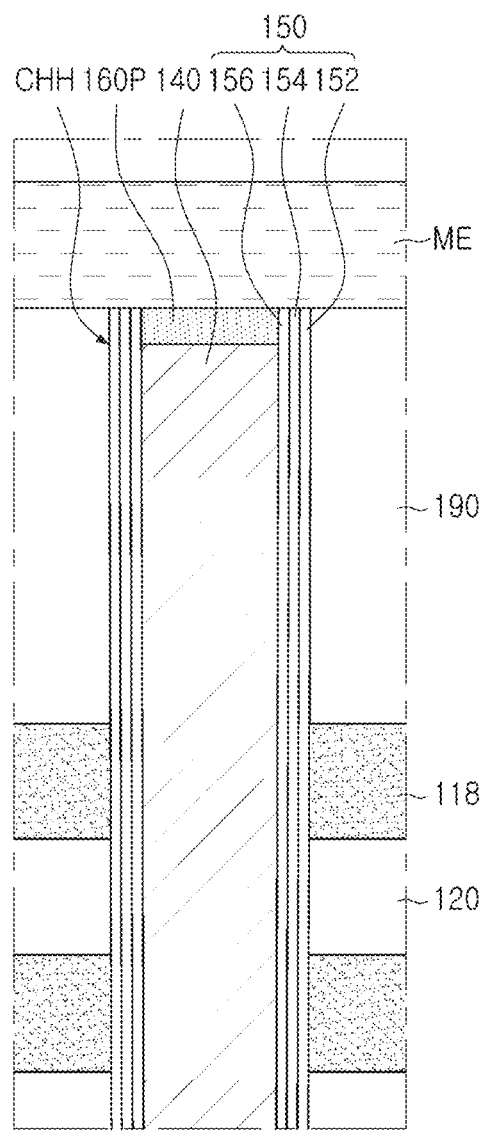

Referring to FIGS. 13A and 13B, a crystallization process of the channel layer 140 may be performed.

First, a metal layer ME may be formed on an upper surface of the channel layer 140, and a metal silicide layer 160P may be formed by a silicidation process. The silicidation process may include deposition of a metal layer with at least one of a physical vapor deposition process or a chemical vapor deposition process; however, example embodiments are not limited thereto. The metal silicide layer 160P may be formed on an upper end of the channel layer 140 by consuming a portion of the channel layer 140. In some example embodiments, an upper surface of the metal silicide layer 160P may consume a portion of the metal layer ME, and may have a shape protruding in an upward direction. A thickness of the metal silicide layer 160P may be, for example, about 5 Å to about 50 Å (about 0.5 nm to about 5 nm), for example about 10 Å to about 30 Å (about 1 nm to about 3 nm).

Next, a heat treatment process may be performed for crystallization of the channel layer 140. The heat treatment process, for example, may be performed in the range of about 300° C. to about 800° C. The channel layer 140 may be crystallized in an MILC manner by the metal silicide layer 160P, and crystallization may be performed from the top (e.g. further away from an upper surface of the substrate 101).

The metal silicide layer 160P may move along/diffuse along the channel layer 140, which may initially be in an amorphous state, in a downward direction, while crystallizing the channel layer 140. Since the channel layer 140 has a pillar shape, the metal silicide layer 160P may more easily move in a downward direction and most of the channel layer 140 may be crystallized by MILC, except for a lower portion of the channel layer 140. When a temperature of the heat treatment process is relatively low, the metal silicide layer 160P may move relatively slowly, and when a temperature of the heat treatment process is relatively high, the metal silicide layer 160P may move quickly, but crystallization by a high temperature, not MILC, may occur.

Figure 14A:
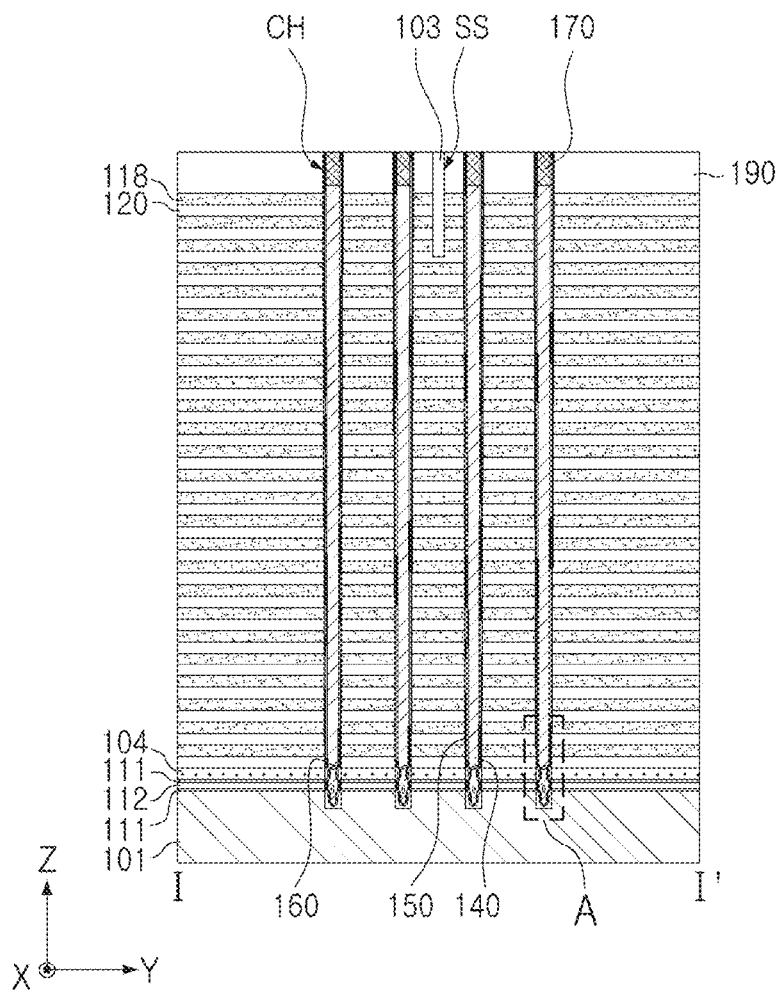
Figure 14B:
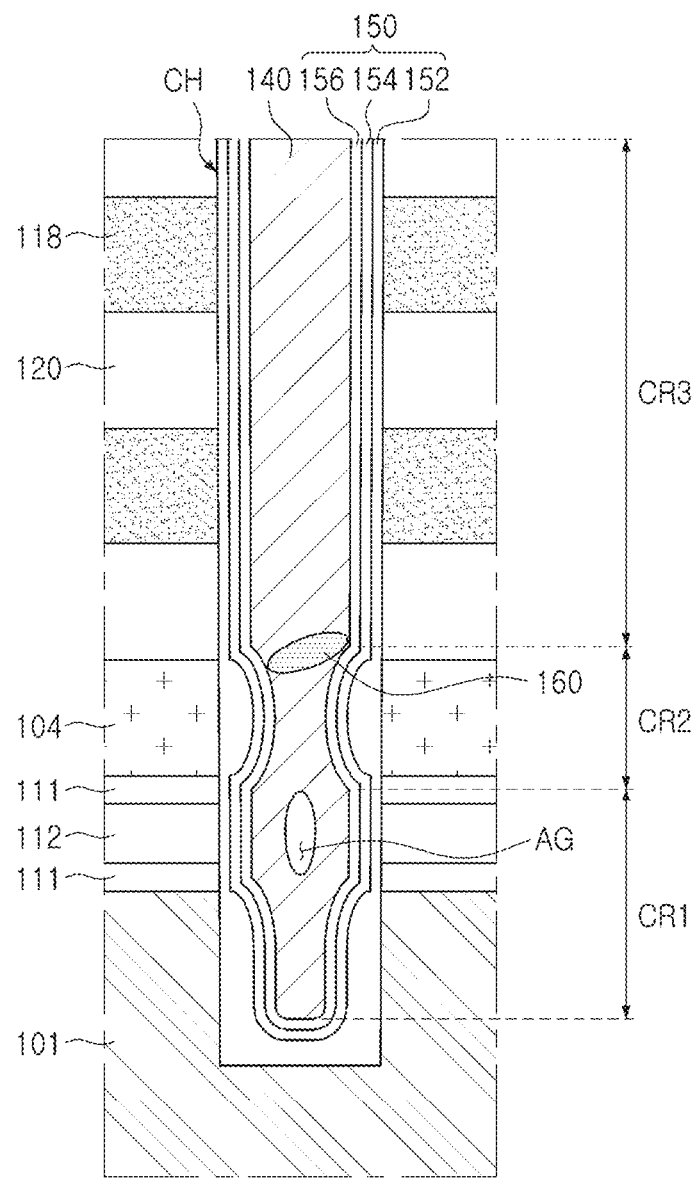

Referring to FIGS. 14A and 14B, a metal silicide region 160 may be formed by collecting the metal silicide layer 160P, and a channel pad 170 may be formed.

After the crystallization process is performed, the metal silicide layer 160P may be collected and fixed in a second region CR2 having a relatively narrow diameter, without being or being too large to be moved further in a downward direction. Therefore, by the crystallization process, the channel layer 140 may be crystallized to have a single crystal structure or a single crystal-like structure on the second horizontal conductive layer 104 by MILC. The channel layer 140 may include a region below the second horizontal conductive layer 104 in which MILC does not proceed and having a polycrystalline structure by a high-temperature crystallization process. The second region CR2 corresponding to a level of the second horizontal conductive layer 104 may have a single crystal structure and/or a polycrystalline structure. For example, a first region CR1 and the second region CR2 below the metal silicide region 160 may have a polycrystalline structure, but is not limited thereto.

Next, the channel pad 170 may be formed in an upper end of the channel holes CHH. The channel pad 170 may be formed of a conductive material, for example, silicon. In some example embodiments, the channel pad 170 may be formed as a portion of the channel layer 140 without being formed by a separate process. Therefore, channel structures CH may be formed.

Figure 15A:
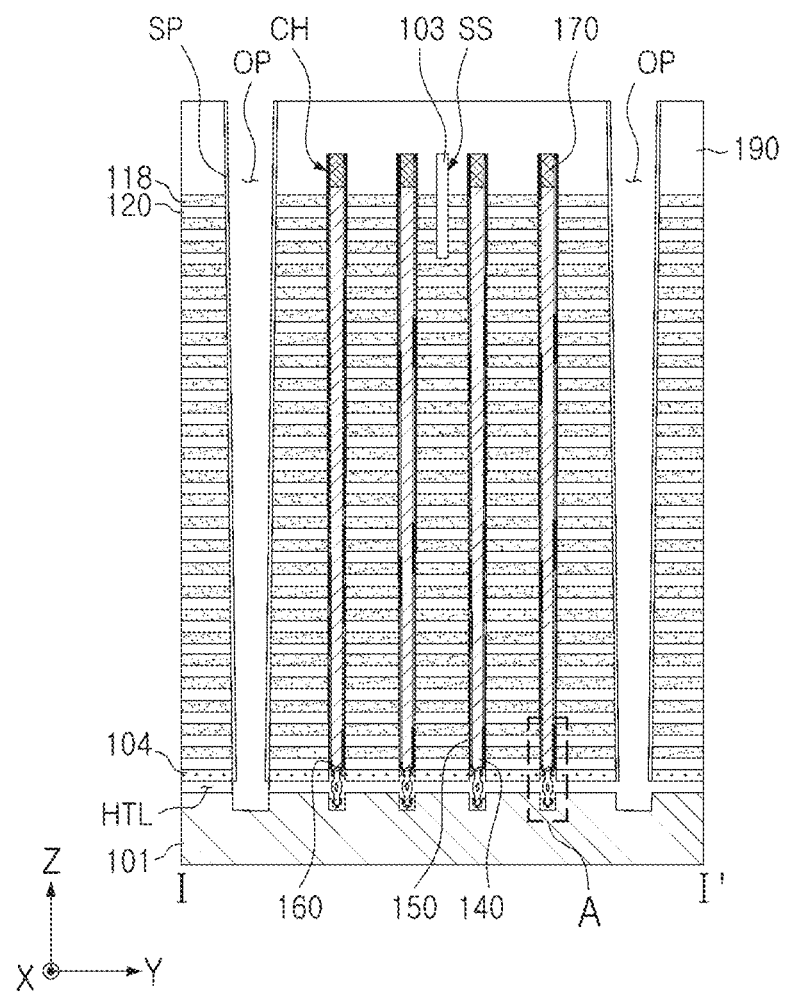
Figure 15B:
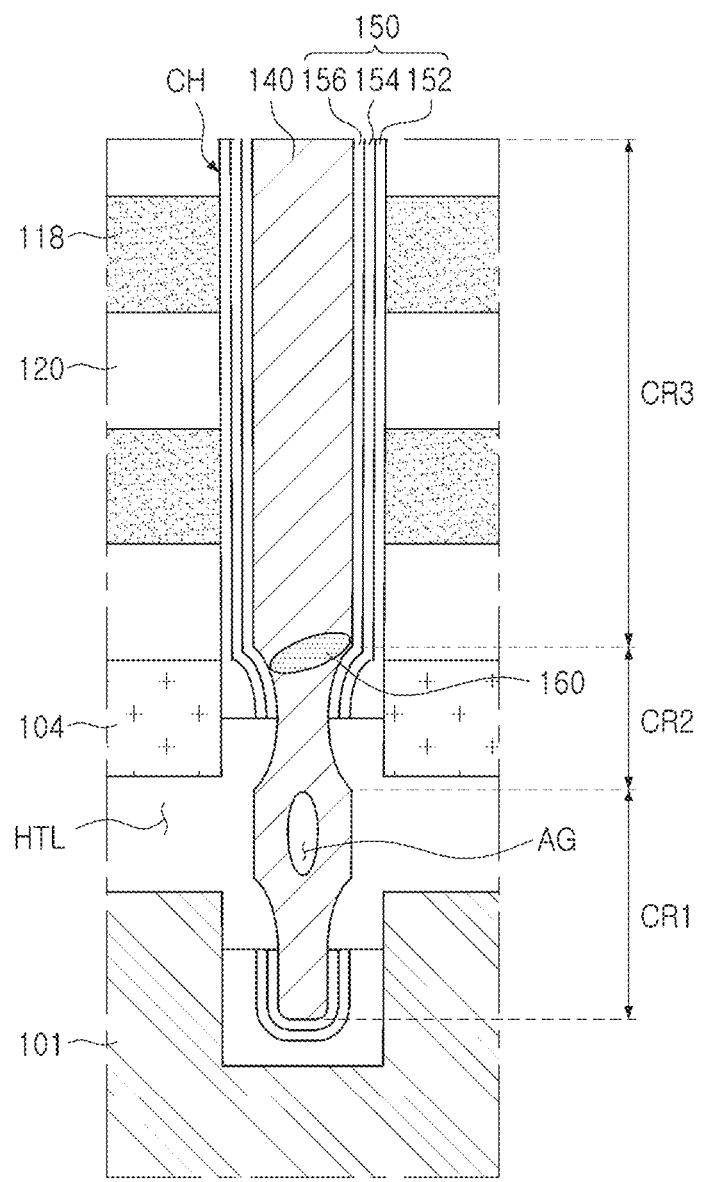

Referring to FIGS. 15A and 15B, trenches OP passing through the stack structure of the sacrificial insulating layers 118 and the interlayer insulating layers 120 may be formed in regions corresponding to separation regions MS (see FIG. 1), and the first and second horizontal sacrificial layers 111 and 112 may be removed to form a horizontal tunnel portion HTL.

First, a cell region insulating layer 190 may be additionally formed on the channel structures CH, and the trenches OP may be formed. The trenches OP may be formed to pass through the stack structure of the sacrificial insulating layers 118 and the interlayer insulating layers 120, pass through the second horizontal conductive layer 104 from the bottom, and extend in the X-direction.

Next, the second horizontal sacrificial layer 112 may be exposed by an etch-back process after forming sacrificial spacer layers SP in the trenches OP. The horizontal tunnel portion HTL may be formed by selectively removing the exposed second horizontal sacrificial layer 112 and then removing the first horizontal sacrificial layers 111 above and below the second horizontal sacrificial layer 112. The first and second horizontal sacrificial layers 111 and 112 may be removed by, for example, a wet etching process. In removing the first and second horizontal sacrificial layers 111 and 112, the gate dielectric layer 150 exposed in a region from which the second horizontal sacrificial layer 112 is removed may be also partially removed together, to expose the channel layer 140.

Figure 16A:
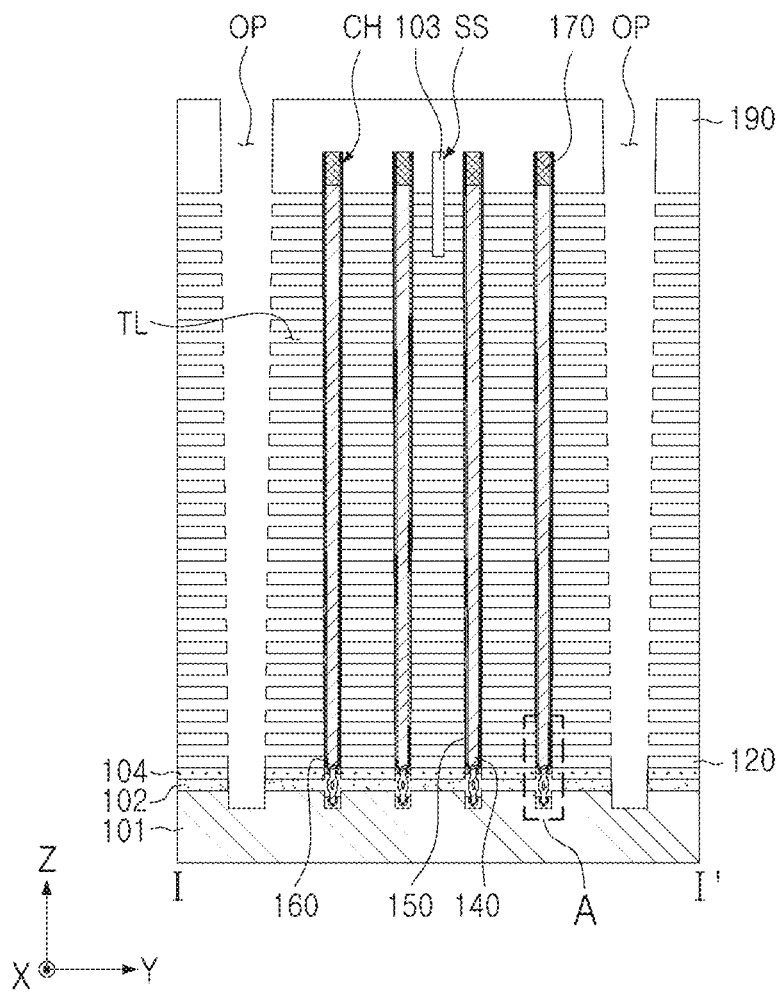
Figure 16B:
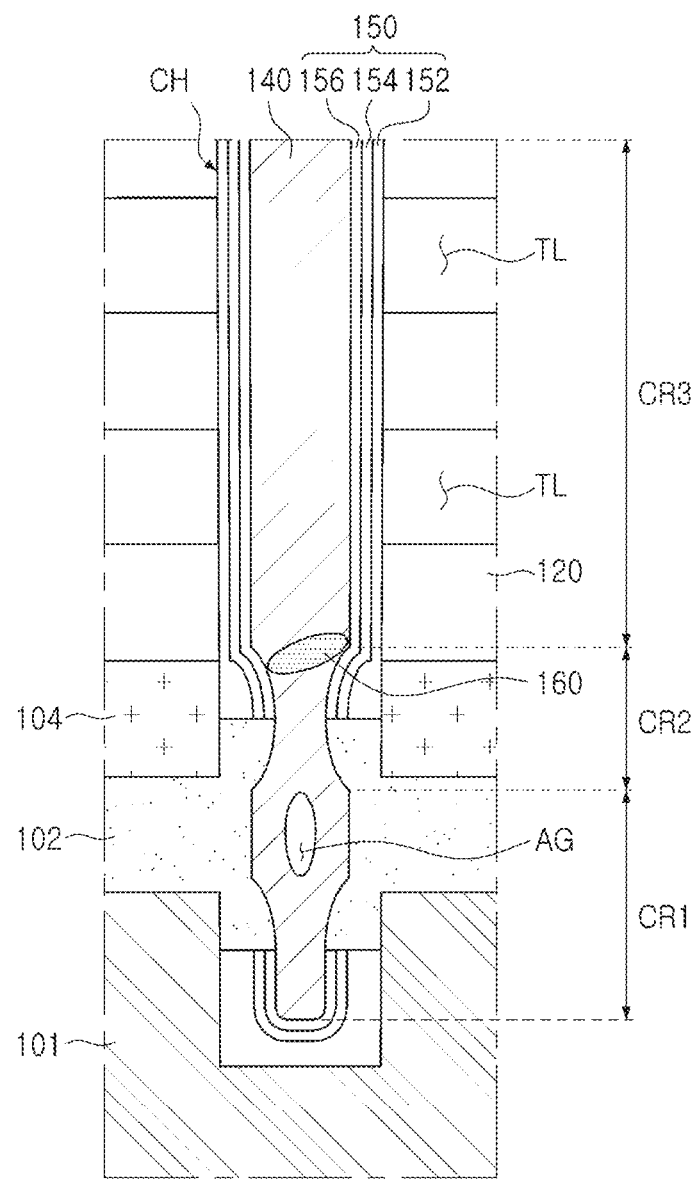

Referring to FIGS. 16A and 16B, a first horizontal conductive layer 102 may be formed, the sacrificial insulating layers 118 may be removed to form tunnel portions TL.

First, the first horizontal conductive layer 102 may be formed by depositing a conductive material in the horizontal tunnel portion HTL, the sacrificial spacer layers SP may be removed in the trenches OP.

Next, the sacrificial insulating layers 118 may be selectively removed with respect to the interlayer insulating layers 120 using, for example, wet etching. Therefore, the tunnel portions TL may be formed as a plurality of tunnel portions TL between the interlayer insulating layers 120.

Figure 17:
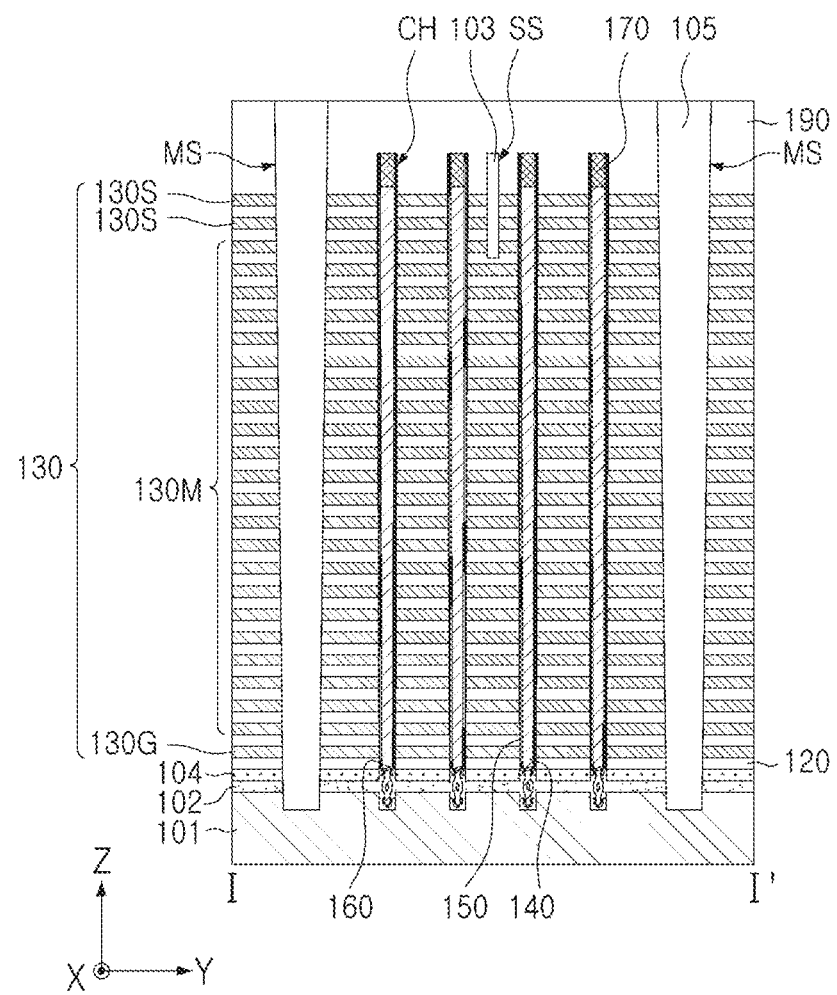

Referring to FIG. 17, the tunnel portions TL may be filled with a conductive material to form gate electrodes 130, and a separation insulating layer 105 may be formed.

First, a horizontal blocking layer 158 (refer to FIG. 3) may be formed in the tunnel portions TL. The conductive material forming the gate electrodes 130 may fill the tunnel portions TL. The conductive material may include a metal, polycrystalline silicon, or a metal silicide material. After forming the gate electrodes 130, the conductive material deposited in the trenches OP may be removed by an additional process to form the separation insulating layer 105. When the conductive material is removed, the gate electrodes 130 may be partially removed from the trenches OP. In this case, the separation insulating layer 105 may include regions partially horizontally extending from the trenches OP to side surfaces of the gate electrodes 130.

Next, referring back to FIG. 2, contact plugs 174 passing through the cell region insulating layer 190 and connected to the channel structures CH may be formed to prepare a semiconductor device 100.

Figure 18:
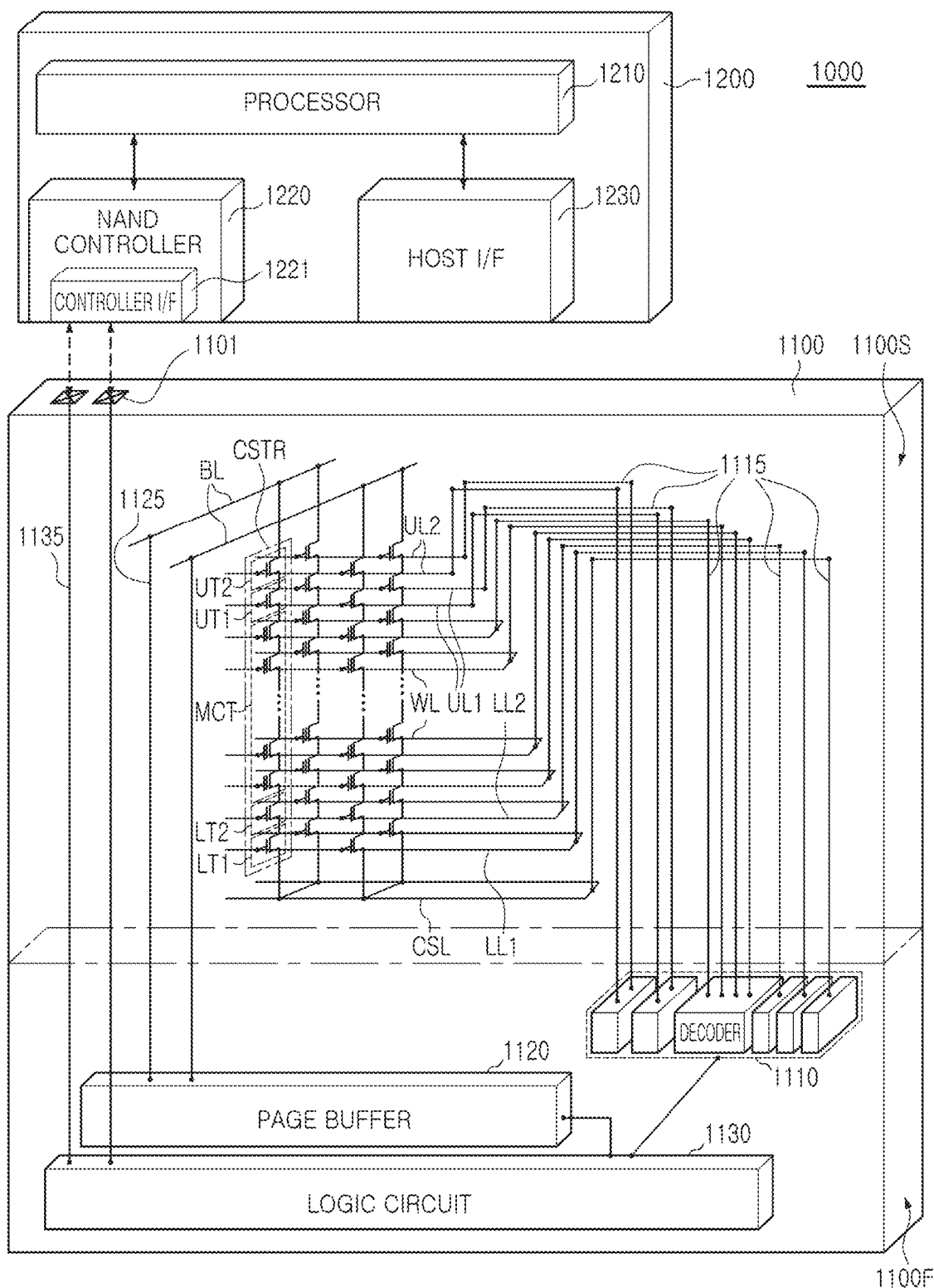
FIG. 18 is a view schematically illustrating a data storage system including a semiconductor device according some example embodiments.

FIG. 18 is a view schematically illustrating a data storage system including a semiconductor device according to some example embodiments.

Referring to FIG. 18, a data storage system 1000 may include a semiconductor device 1100, and a controller 1200 electrically connected to the semiconductor device 1100. The data storage system 1000 may be a storage device including the semiconductor device 1100 as one or more, or an electronic device including the storage device. For example, the data storage system 1000 may be a solid state drive device (SSD), a universal serial bus (USB), a computing system, a medical device, or a communication device, including the semiconductor device 1100 as one or more.

The semiconductor device 1100 may be or may include a non-volatile memory device, and may be, for example, the NAND flash memory device described above with reference to FIGS. 1 to 9. The semiconductor device 1100 may include a first structure 1100F, and a second structure 1100S on the first structure 1100F. In some example embodiments, the first structure 1110F may be disposed next to the second semiconductor structure 1100S. The first structure 1100F may be a peripheral circuit structure including a decoder circuit 1110, a page buffer 1120, and a logic circuit 1130. The second structure 1100S may be a memory cell structure including bit lines BL, a common source line CSL, word lines WL, first and second upper gate lines UL1 and UL2, first and second lower gate lines LL1 and LL2, and memory cell strings CSTR between the bit lines BL and the common source line CSL.

In the second structure 1100S, each of the memory cell strings CSTR may include lower transistors LT1 and LT2 adjacent to the common source line CSL, upper transistors UT1 and UT2 adjacent to the bit lines BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be variously changed according to various example embodiments.

In example embodiments, the upper transistors UT1 and UT2 may include a string select transistor, and the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

In some example embodiments, the lower transistors LT1 and LT2 may include a lower erase control transistor LT1 and a ground select transistor LT2, connected in series. The upper transistors UT1 and UT2 may include a string select transistor UT1 and an upper erase control transistor UT2, connected in series. At least one of the lower erase control transistor LT1 or the upper erase control transistor UT2 may be used for an erase operation of erasing data stored in the memory cell transistors MCT using a gate-induced-drain-leakage (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection wirings 1115 extending from the first structure 1100F into the second structure 1100S. The bit lines BL may be electrically connected to the page buffer 1120 through second connection wirings 1125 extending from the first structure 1100F into the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through input/output connection wirings 1135 extending from the first structure 1100F into the second structure 1100S.

The controller 1200 may include a processor 1210, a NAND controller 1220, and a host interface 1230. According to various example embodiments, the data storage system 1000 may include a plurality of semiconductor devices 1100, and in this case, the controller 1200 may control the plurality of semiconductor devices 1100.

The processor 1210 may control an overall operation of the data storage system 1000 including the controller 1200. The processor 1210 may operate according to a predetermined firmware, and may access to the semiconductor device 1100 by controlling the NAND controller 1220. The NAND controller 1220 may include a NAND interface 1221 processing communications with the semiconductor device 1100. A control command for controlling the semiconductor device 1100, data to be written to the memory cell transistors MCT of the semiconductor device 1100, data to be read from the memory cell transistors MCT of the semiconductor device 1100, or the like may be transmitted through the NAND interface 1221. The host interface 1230 may provide a communication function between the data storage system 1000 and an external host. When a control command is received from the external host through the host interface 1230, the processor 1210 may control the semiconductor device 1100 in response to the control command.

Figure 19:
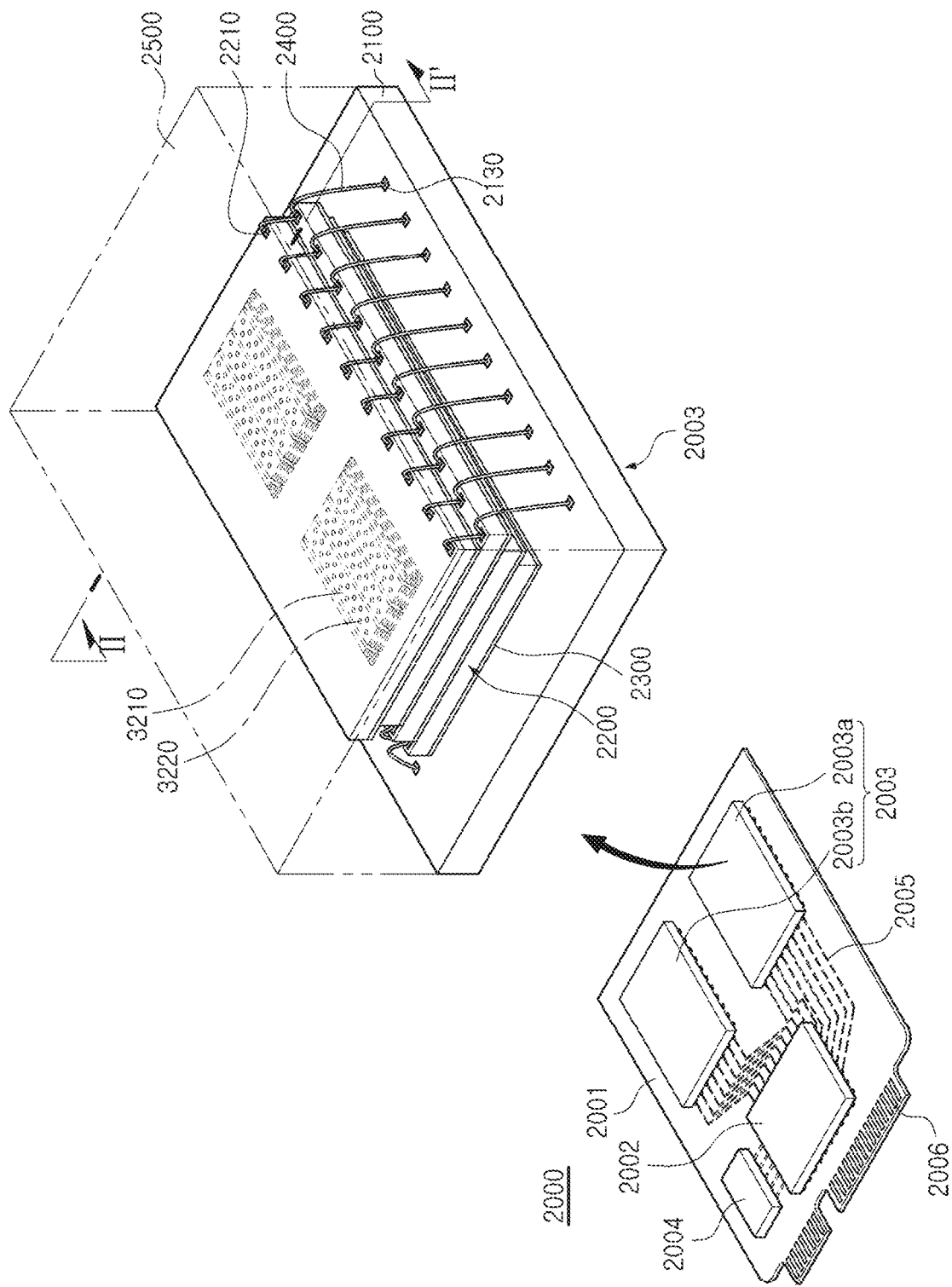
FIG. 19 is a schematic perspective view of a data storage system including a semiconductor device according to some example embodiments.

FIG. 19 is a schematic perspective view of a data storage system including a semiconductor device according to some example embodiments.

Referring to FIG. 19, a data storage system 2000 according to some example embodiments of inventive concepts may include a main substrate 2001, a controller 2002 mounted on the main substrate 2001, at least one semiconductor package 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins, which may be coupled to an external host. The number and/or an arrangement of the plurality of pins in the connector 2006 may vary according to a communication interface between the data storage system 2000 and the external host. In example embodiments, the data storage system 2000 may be communicated with the external host according to any one interface of a universal serial bus (USB), peripheral component interconnection express (PCI-Express), serial advanced technology attachment (SATA), M-Phy for universal flash storage (UFS), or the like. In example embodiments, the data storage system 2000 may be operated by power supplied from the external host through the connector 2006. The data storage system 2000 may further include a power management integrated circuit (PMIC) distributing power, supplied from the external host to the controller 2002 and the semiconductor package 2003.

The controller 2002 may write data to the semiconductor package 2003 and/or read data from the semiconductor package 2003, and may improve an operation speed of the data storage system 2000.

The DRAM 2004 may be or may correspond to a buffer memory reducing a difference in speed between the semiconductor package 2003, which may be a data storage space, and the external host. The DRAM 2004 included in the data storage system 2000 may also or alternatively operate as a type of cache memory, and may provide a space temporarily storing data in a control operation on the semiconductor package 2003. When the DRAM 2004 is included in the data storage system 2000, the controller 2002 may further include a DRAM controller controlling the DRAM 2004 in addition to a NAND controller controlling the semiconductor package 2003; however, example embodiments are not limited thereto, and the NAND controller may be configured to control the DRAM device.

The semiconductor package 2003 may include first and second semiconductor packages 2003a and 2003b, spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting the semiconductor chips 2200 and the package substrate 2100, and a molding layer 2500 covering the semiconductor chips 2200 and the connection structure 2400 on the package substrate 2100.

The package substrate 2100 may be or may include a printed circuit board including package upper pads 2130. Each of the semiconductor chips 2200 may include an input/output pad 2210. The input/output pad 2210 may correspond to the input/output pad 1101 of FIG. 18. Each of the semiconductor chips 2200 may include gate stack structures 3210 and channel structures 3220. Each of the semiconductor chips 2200 may include the semiconductor device described above with reference to FIGS. 1 to 9, and may include the same, or differently embodied, semiconductor devices.

In example embodiments, the connection structure 2400 may be a bonding wire electrically connecting the input/output pad 2210 and the upper package pads 2130. Therefore, in each of the first and second semiconductor packages 2003a and 2003b, the semiconductor chips 2200 may be electrically connected to each other by a bonding wire process, and may be electrically connected to the package upper pads 2130 of the package substrate 2100. According to various example embodiments, in each of the first and second semiconductor packages 2003a and 2003b, the semiconductor chips 2200 may be electrically connected to each other by a connection structure including a through silicon via (TSV), instead of or in addition to a connection structure 2400 by a bonding wire process.

In some example embodiments, the controller 2002 and the semiconductor chips 2200 may be included in one (1) package. In some example embodiments, the controller 2002 and the semiconductor chips 2200 may be mounted on a separate interposer substrate, different from the main substrate 2001, and the controller 2002 and the semiconductor chips 2200 may be connected to each other by a wiring formed on the interposer substrate.

Figure 20:
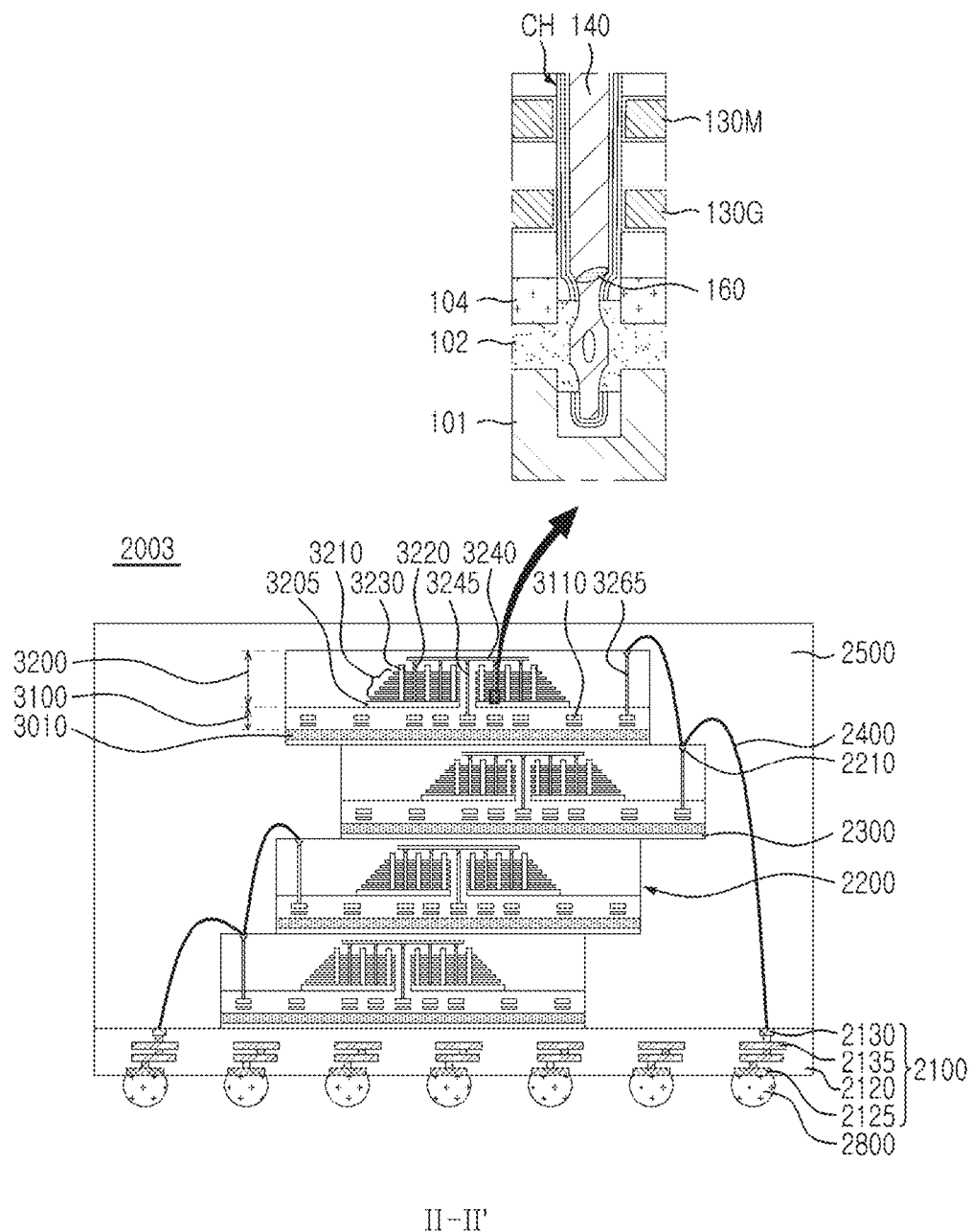
FIG. 20 is a cross-sectional view schematically illustrating a semiconductor package according to some example embodiments.

FIG. 20 is a cross-sectional view schematically illustrating a semiconductor package according to some example embodiments. FIG. 20 illustrates example embodiments of the semiconductor package 2003 of FIG. 19, and conceptually illustrates a region taken along line II-II' of the semiconductor package 2003 of FIG. 19.

Referring to FIG. 20, in the semiconductor package 2003, the package substrate 2100 may be a printed circuit board. The package substrate 2100 may include a package substrate body portion 2120, package upper pads 2130 disposed on an upper surface of the package substrate body portion 2120 (see FIG. 19), lower pads 2125 disposed on a lower surface of the package substrate body portion 2120 or exposed from the lower surface, and internal wirings 2135 electrically connecting the upper pads 2130 and the lower pads 2125 in the package substrate body portion 2120. The upper pads 2130 may be electrically connected to the connection structures 2400. The lower pads 2125 may be connected to the wiring patterns 2005 of the main substrate 2001 of the data storage system 2000, as illustrated in FIG. 19, through conductive connection portions 2800.

Each of the semiconductor chips 2200 may include a semiconductor substrate 3010, and a first semiconductor structure 3100 and a second semiconductor structure 3200, sequentially stacked on the semiconductor substrate 3010. The first semiconductor structure 3100 may include a peripheral circuit region including peripheral wirings 3110. The second semiconductor structure 3200 may include a common source line 3205, a gate stack structure 3210 on the common source line 3205, channel structures 3220 and separation regions 3230, passing through the gate stack structure 3210, bit lines 3240 electrically connected to the memory channel structures 3220, and gate contact plugs 3235 electrically connected to word lines WL (refer to FIG. 18) of the gate stack structure 3210. As described above with reference to FIGS. 1 to 9, in each of the semiconductor chips 2200, the channel layer 140 in the channel structure CH may have a narrow region, and the channel structure CH may include a metal silicide region 160 disposed adjacent to the region.

Each of the semiconductor chips 2200 may include a through-wiring 3245 electrically connected to the peripheral wirings 3110 of the first semiconductor structure 3100 and extending into the second semiconductor structure 3200. The through-wiring 3245 may disposed outside the gate stack structure 3210, and may be further disposed to pass through the gate stack structure 3210. Alternatively or additionally, each of the semiconductor chips 2200 may further include an input/output pad 2210 electrically connected to the peripheral wirings 3110 of the first semiconductor structure 3100 (refer to FIG. 19).

A semiconductor device having improved reliability and/or electrical characteristics and a data storage system including the same may be provided by having a lower region in a channel layer having a reduced width and collecting a metal silicide region in the region.

Various advantages and/or effects of inventive concepts are not limited to the above, and will be more easily understood in the process of describing various example embodiments of inventive concepts.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While some example embodiments have been illustrated and described above, it will be apparent to those of ordinary skill in the art that modifications and variations could be made without departing from the scope of inventive concepts as defined by the appended claims. Furthermore variously described example embodiments are not necessarily mutually exclusive with one another. For example, some example embodiments may include features described with reference to one or more figures, and may also include features described with reference to one or more other figures.

What is claimed is:

1. A semiconductor device comprising:
a substrate;
gate electrodes apart from each other and stacked in a first direction perpendicular to an upper surface of the substrate;
a first horizontal conductive layer on the substrate and below the gate electrodes;
a second horizontal conductive layer on the first horizontal conductive layer and below the gate electrodes; and
a channel structure passing through the gate electrodes and in a channel hole extending in the first direction, the channel structure including a gate dielectric layer on an inner side surface of and a bottom surface of the channel hole, and a channel layer inside the gate dielectric layer, the channel layer filling the channel hole and contacting the first horizontal conductive layer,
wherein the channel layer includes a first region adjacent to the first horizontal conductive layer and having a first diameter, a second region on the first region, adjacent to the second horizontal conductive layer, and having a second diameter, and a third region on the second region, adjacent the gate electrodes, and having a third diameter, wherein the second diameter is less than the first diameter and less than the third diameter,
the channel structure further includes a metal silicide region at least partially located in at least one of the first region or the second region of the channel layer, and
the channel layer has different degrees of crystallization above and below the metal silicide region.

2. The semiconductor device of claim 1, wherein the first region of the channel layer has a polycrystalline structure, and the third region of the channel layer has at least one of a single crystal structure or a single crystal-like structure.

3. The semiconductor device of claim 1, wherein the channel layer has a fourth diameter at a first height level between an upper surface of the second horizontal conductive layer and a lower surface of the second horizontal conductive layer, that is less than a fifth diameter at a second height level of the upper surface of the second horizontal conductive layer and less than a sixth diameter at a third height level of the lower surface of the second horizontal conductive layer.

4. The semiconductor device of claim 1, wherein the metal silicide region has a first length, longer than the second diameter, in at least one direction.

5. The semiconductor device of claim 4, wherein the metal silicide region has a second length, smaller than the first length and smaller than the third diameter, in a direction perpendicular to the one direction.

6. The semiconductor device of claim 1, wherein
the metal silicide region has a first length in one direction, and a second length, smaller than the first length, in a direction perpendicular to the one direction, and
the second length is about 0.5 nm to about 5 nm.

7. The semiconductor device of claim 1, wherein the first region of the channel layer defines an air gap.

8. The semiconductor device of claim 7, wherein the metal silicide region contacts the air gap.

9. The semiconductor device of claim 7, wherein the third region of the channel layer does not have an air gap and does not have a seam.

10. The semiconductor device of claim 1, wherein the gate dielectric layer comprises a blocking layer, a charge storage layer, and a tunneling layer, the blocking layer, the charge storage layer, and the tunneling layer sequentially stacked,
wherein the blocking layer has a first thickness on side surfaces of the gate electrodes, and a second thickness, greater than the first thickness, on a side surface of the second horizontal conductive layer.

11. The semiconductor device of claim 10, wherein the metal silicide region is in contact with at least one of the channel layer, the first horizontal conductive layer, or the tunneling layer.

12. The semiconductor device of claim 1, wherein the metal silicide region comprises at least one of nickel silicide (NiSi), titanium silicide (TiSi), cobalt silicide (CoSi), or tungsten silicide (WSi).

13. The semiconductor device of claim 1, further comprising:
circuit elements below the substrate and electrically connected to the gate electrodes and the channel structure.

14. The semiconductor device of claim 1, wherein an upper surface of the metal silicide region and a lower surface of the metal silicide region are in contact with the channel layer.

15. A semiconductor device comprising:
a substrate;
gate electrodes spaced apart from each other and stacked in a direction perpendicular to an upper surface of the substrate;

first and second horizontal conductive layers sequentially stacked between the substrate and the gate electrodes; and a channel structure passing through the gate electrodes and extending perpendicularly, and including a channel layer contacting the first horizontal conductive layer, wherein the channel layer has a region having a reduced diameter below a first level in which a lower surface of a lowermost one of the gate electrodes is located, the channel structure further includes a metal silicide region below the first level and in the channel structure to contact the channel layer, and the channel layer comprises a first region on the metal silicide region and a second region disposed below the metal silicide region.

16. The semiconductor device of claim 15, wherein the channel structure further comprises a gate dielectric layer on an outer side surface of the channel layer, and a channel buried insulating layer on an inner side surface of the channel layer, the channel layer comprises a third region above the first level and having a cylindrical shape surrounding the channel buried insulating layer, and a fourth region below the first level and having a pillar shape.

17. The semiconductor device of claim 15, wherein the channel layer comprises a third region above the first level and having a polycrystalline structure, and a fourth region disposed below the first level and having at least one of a single crystal structure or a single crystal-like structure.

18. The semiconductor device of claim 15, wherein the metal silicide region is between the first level and a second level on which the upper surface of the substrate is located.

19. A data storage system comprising:

a semiconductor storage device including a substrate, circuit elements on one side of the substrate, and an input/output pad electrically connected to the circuit elements; and a controller electrically connected to the semiconductor storage device through the input/output pad and configured to control the semiconductor storage device, wherein the semiconductor storage device further includes, gate electrodes apart from each other and stacked in a direction, perpendicular to an upper surface of the substrate, first and second horizontal conductive layers sequentially stacked between the substrate and the gate electrodes, and a channel structure passing through the gate electrodes and extending perpendicularly, and including a channel layer contacting the first horizontal conductive layer, wherein the channel layer has a region having a reduced diameter below a first level in which a lower surface of a lowermost gate electrode is located, among the gate electrodes, the channel structure further includes a metal silicide region below the first level and in the channel structure and contacting the channel layer, and the channel layer comprises a first region on the metal silicide region and a second region disposed below the metal silicide region.

20. The data storage system of claim 19, wherein the channel layer has crystallization degree above the metal silicide region and a different crystallization degree below the metal silicide region.

* * * * *